(12) United States Patent
Woytowich et al.

(10) Patent No.: US 10,748,273 B2
(45) Date of Patent: Aug. 18, 2020

(54) EVALUATING A DESIGN OF A COMPUTER VISION INSPECTION STATION

(71) Applicant: The Gillette Company LLC, Boston, MA (US)

(72) Inventors: Brian Joseph Woytowich, Somerville, MA (US); Lucy Lin, Quincy, MA (US); Gregory David Aviza, Marlborough, MA (US)

(73) Assignee: The Gillette Company LLC, Boston, MA (US)

( * ) Notice: Subject to any disclaimer, the term of this patent is extended or adjusted under 35 U.S.C. 154(b) by 96 days.

(21) Appl. No.: 16/192,540

(22) Filed: Nov. 15, 2018

(65) Prior Publication Data

US 2020/0160507 A1    May 21, 2020

(51) Int. Cl.
*G06T 7/00*      (2017.01)
*G06T 15/50*     (2011.01)
*G06T 17/00*     (2006.01)
*G06F 30/20*     (2020.01)

(52) U.S. Cl.
CPC ............ *G06T 7/0006* (2013.01); *G06F 30/20* (2020.01); *G06T 15/506* (2013.01); *G06T 17/00* (2013.01)

(58) Field of Classification Search
CPC ....... G01N 21/95607; G03F 1/26; G03F 1/72; G03F 1/84
See application file for complete search history.

(56) References Cited

U.S. PATENT DOCUMENTS 6,836,560 B2 * 12/2004 Emery ............. G01N 21/95607
                                                356/237.6
2011/0313559 A1 * 12/2011 Aviza ................... B25J 11/005
                                                700/110

* cited by examiner

*Primary Examiner* — Manuchehr Rahmjoo
(74) *Attorney, Agent, or Firm* — Joanne N. Pappas; Kevin C. Johnson

(57) ABSTRACT

Evaluating a design of a configurable inspection station for inspecting a workpiece, wherein the design of the configurable inspection station has a plurality of changeable parameters and including a computer vision system or another system that can iteratively change an instance of one of the parameters.

24 Claims, 18 Drawing Sheets

US 10,748,273 B2

EVALUATING A DESIGN OF A COMPUTER VISION INSPECTION STATION

FIELD OF THE INVENTION

The present disclosure relates generally to an article of manufacture inspection station and, more particularly, to utilizing computer vision with such an inspection station.

BACKGROUND OF THE INVENTION

The design of a product inspection station involves making and testing a physical prototype of a product and an inspection station in order to optimize the layout and parameters of the vision components in the inspection station and the design of the product. Optimizing this setup tends to be an iterative process and may require multiple product prototypes and/or inspection station prototypes.

SUMMARY OF THE INVENTION

One aspect of the present invention relates to a method for evaluating a design of a configurable inspection station for inspecting a workpiece, the design of the configurable inspection station having a plurality of variable parameters. The method includes determining, by a processor, an initial better image from a comparison of two simulated images, each of the two simulated images generated by an image rendering application based on respective corresponding configurations of the design of the configurable inspection station, each corresponding configuration comprising a respective set of instances for the plurality of variable parameters. The method also includes iteratively performing a set of steps comprising: a) providing a new configuration of the design of the configurable inspection station, the new configuration comprising a new set of instances for the plurality of variable parameters, wherein one instance of one parameter is different in the new set as compared to a set corresponding to a test image, and wherein the initial better image comprises the test image for a first iteration and a subsequent image comprises the test image for subsequent iterations; b) generating a new simulated image based on the new configuration; c) determining, by the processor utilizing a computer vision application in communication with the image rendering application, a first inspectability metric associated with the test image; d) determining, by the processor utilizing the computer vision application, a second inspectability metric associated with the new simulated image; and e) when the second inspectability metric is higher than the first inspectability metric, performing a subsequent iteration with the new simulated image becoming the subsequent image.

In one example, the processor performs each of the set of steps, in another example a second processor performs the steps of providing a new configuration of the design of the configurable inspection station and generating a new simulated image.

In accordance with this aspect, the set of steps iteratively performed further comprises that when the first inspectability metric is higher than the second inspectability metric, determining whether the first inspectability metric was higher than the second inspectability metric for a predetermined number of immediately preceding iterations; wherein when the first inspectability metric was not higher than the second inspectability metric for the predetermined number of immediately preceding iterations, performing the subsequent iteration with the test image remaining the subsequent image.

In accordance with this aspect, the set of steps iteratively performed further comprises that when the first inspectability metric is higher than the second inspectability metric, determining whether the first inspectability metric was higher than the second inspectability metric for a predetermined number of immediately preceding iterations; wherein when the first inspectability metric was higher than the second inspectability metric for the predetermined number of immediately preceding iterations, stop performing iterations. Also, after performing iterations has stopped, identifying, by the processor, a best image having a highest associated inspectability metric; and selecting an optimal instance for the one parameter based on the configuration of the design of the configurable inspection station corresponding with the best image.

Further in accordance with this aspect, the first inspectability metric is indicative of a visual discernibility of a feature corresponding to an attribute of the workpiece in the test image. Also, the second inspectability metric is indicative of a visual discernibility of a feature corresponding to an attribute of the workpiece in the new simulated image.

In an example, the attribute of the workpiece comprises one of a geometric feature, an edge, a two-dimensional logo, a three-dimensional logo, a corner or a surface section of the workpiece. As another example, the one parameter comprises an illumination parameter. As yet another example, the one instance of the illumination parameter in the new set comprises a new lighting model or a new light mapping.

In accordance with this aspect, for a second and all subsequent iterations, the set of steps further comprises determining the one instance of the one parameter based on: a) an instance of the one parameter in an immediately preceding iteration, and b) whether or not the second inspectability metric was greater than the first inspectability metric, in the immediately preceding iteration.

Another aspect of the present invention relates to a system for evaluating a design of a configurable inspection station for inspecting a workpiece, the design of the configurable inspection station having a plurality of variable parameters, wherein the system includes a memory storing executable instructions and a processor in communication with the memory. In particular, the processor when executing the executable code determines an initial better image from a comparison of two simulated images, each of the two simulated images generated by an image rendering application based on respective corresponding configurations of the design of the configurable inspection station, each corresponding configuration comprising a respective set of instances for the plurality of variable parameters. The processor also iteratively performs a set of steps comprising: a) receives from an image rendering application a new simulated image based on a new configuration; wherein the new configuration comprises a new set of instances for the plurality of variable parameters, wherein one instance of one parameter is different in the new set as compared to a set corresponding to a test image, and wherein the initial better image comprises the test image for a first iteration and a subsequent image comprises the test image for subsequent iterations; b) determines, utilizing a computer vision application in communication with the image rendering application, a first inspectability metric associated with the test image; c) determines, utilizing the computer vision application, a second inspectability metric associated with the new simulated image; and d) when the second inspectability metric is higher than the first inspectability metric, performs a subsequent iteration with the new simulated image becoming the subsequent image.

In accordance with this aspect, the set of steps iteratively performed further comprises that when the first inspectability metric is higher than the second inspectability metric, determining whether the first inspectability metric was higher than the second inspectability metric for a predetermined number of immediately preceding iterations; wherein when the first inspectability metric was not higher than the second inspectability metric for the predetermined number of immediately preceding iterations, performing the subsequent iteration with the test image remaining the subsequent image.

In accordance with this aspect, the set of steps iteratively performed further comprises that when the first inspectability metric is higher than the second inspectability metric, determining whether the first inspectability metric was higher than the second inspectability metric for a predetermined number of immediately preceding iterations; wherein when the first inspectability metric was higher than the second inspectability metric for the predetermined number of immediately preceding iterations, stop performing iterations. Also, after performing iterations has stopped, identifying, by the processor, a best image having a highest associated inspectability metric; and selecting an optimal instance for the one parameter based on the configuration of the design of the configurable inspection station corresponding with the best image.

Further in accordance with this aspect, the first inspectability metric is indicative of a visual discernibility of a feature corresponding to an attribute of the workpiece in the test image. Also, the second inspectability metric is indicative of a visual discernibility of a feature corresponding to an attribute of the workpiece in the new simulated image.

In an example, the attribute of the workpiece comprises one of a geometric feature, an edge, a two-dimensional logo, a three-dimensional logo, a corner or a surface section of the workpiece. As another example, the one parameter comprises an illumination parameter. As yet another example, the one instance of the illumination parameter in the new set comprises a new lighting model or a new light mapping.

In accordance with this aspect, for a second and all subsequent iterations, the set of steps further comprises determining the one instance of the one parameter based on: a) an instance of the one parameter in an immediately preceding iteration, and b) whether or not the second inspectability metric was greater than the first inspectability metric, in the immediately preceding iteration.

BRIEF DESCRIPTION OF THE DRAWINGS

So the manner in which the above recited features of the present disclosure may be understood in detail, a more particular description of embodiments of the present disclosure, briefly summarized above, may be had by reference to embodiments, which are illustrated in the appended drawings. It is to be noted, however, the appended drawings illustrate only typical embodiments encompassed within the scope of the present disclosure, and, therefore, are not to be considered limiting, for the present disclosure may admit to other equally effective embodiments, wherein:

FIGS. 3, 4A, 4B, and 5A-5F depict example light mappings in accordance with the principles of the present invention;

DETAILED DESCRIPTION OF THE INVENTION

When using a typical computer-vision system or software during the design of a product inspection station, it has been beneficial to make and test a physical prototype of a product and an inspection station in order to optimize the layout and parameters of the vision components in the inspection station and the design of the product. This allows the inspection station designer to understand the interactions of the lighting with the product and how it affects the final image captured by an inspection camera. In some cases, minor alterations to the location of light sources, the camera, other imaging components (e.g., mirror or reflector), a workpiece holder and/or a product with respect to each other, the number and type of light sources, the design of a workpiece holder, the color of portions of a product or workpiece holder, the type/design of other imaging components (e.g., mirror or reflector), and the design of one or more attributes on a product to be inspected may have a major effect on the quality of the final image captured at an inspection station. Furthermore, optimizing this setup tends to be an iterative process and may require multiple product prototypes and/or inspection station design changes, which can substantially add cost and time to a given product development project. Having a method for predicting these interactions and their effect on the final image in a virtual environment may help streamline the design process of a product and a product inspection station and potentially save time and money.

In accordance with the principles of the present disclosure, a design method utilizes existing rendering (ray tracing) software to render a photorealistic predicted image of a part or product being inspected by a vision system. Having a "virtual vision system" allows a designer to modify parameters of a computer vision based inspection station and/or product or part to be inspected and see the effects of these changes in near real time. In many cases this provides insights that would otherwise require a physical prototype to obtain. For example, this method could be used to predict shadowed or washed out attributes on a manufactured part that would prevent those attributes from being properly inspected. Identifying such an issue at an early stage in the design process allows for early correction, thereby saving significant tooling costs and time.

Figure 1A:
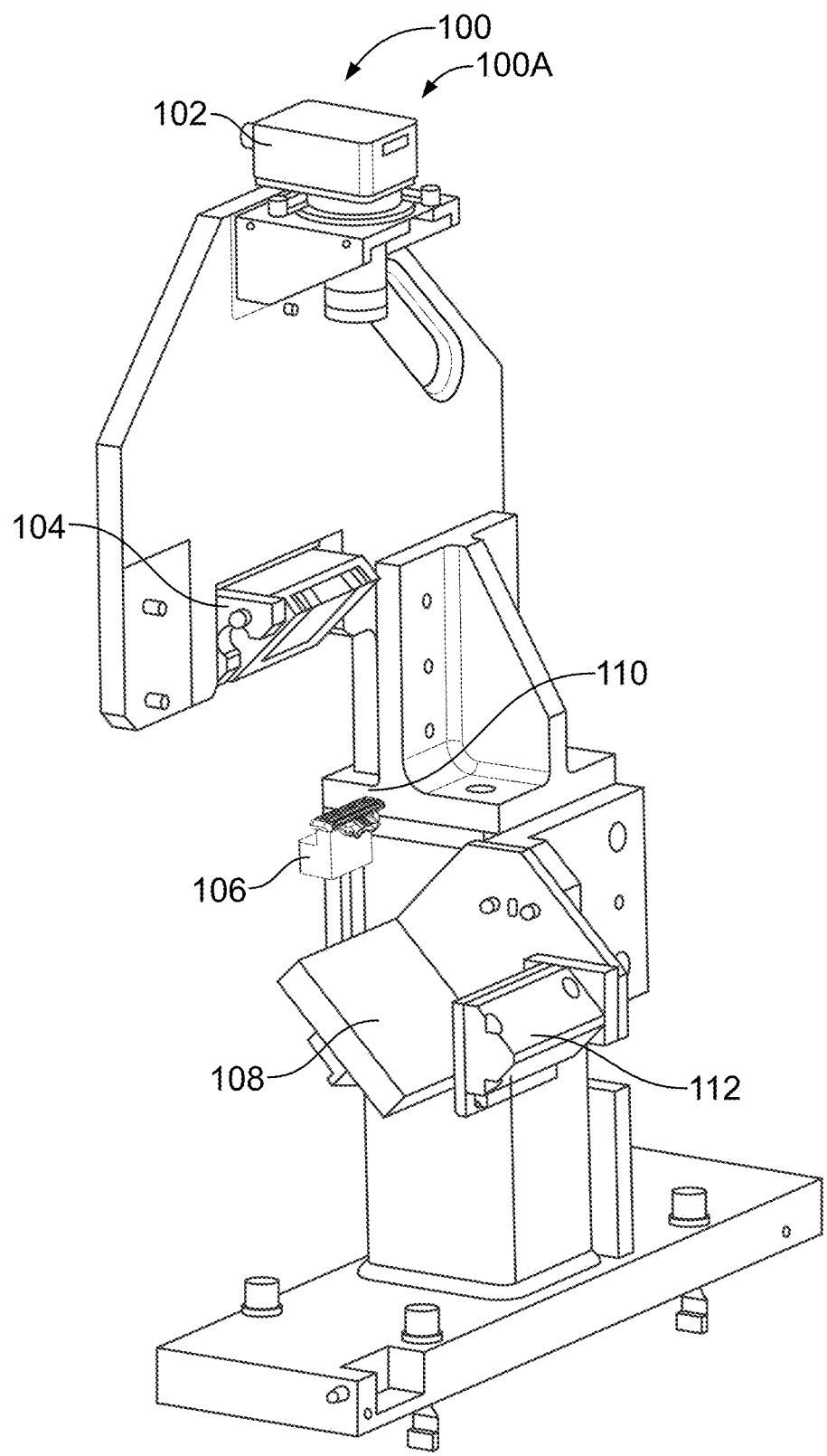
FIG. 1A illustrates a product inspection station in accordance with the principles of the present disclosure.

FIG. 1A illustrates an example computer vision based product inspection station (physical or real) 100 to inspect actual products or parts to determine if those products or parts have defects or imperfections. The terms "product," "part" and "workpiece" are used interchangeably herein to refer to a product or portion of a product that is to be inspected using an inspection station, such as the station 100 of FIG. 1A. The computer vision based inspection station 100 includes a camera 102 that captures one or more images of a workpiece 110. There may be one or more lights such as a top light 104 and a back light 112, which illuminate the workpiece 110. A reflector 108 may also be present that helps ensure light is directed at the workpiece 110 in a desired manner. The workpiece 110 can be held in position by a workpiece fixture 106.

Each of the components of the inspection station 100, and a part or product to be inspected, can be simulated, or modeled, with a computer aided design (CAD) model. Thus, in accordance with the present disclosure, the physical structure and layout of components of the inspection station 100 are simulated to create a modeled inspection station 100A that is created and is configurable using conventional computer modeling software. Also, the physical structure of the part is simulated to create a modeled part that is created and configurable using conventional computer modeling software. As a result, the shapes, positions, orientation and layout of all the components of the inspection station 100, including the part or product to be inspected, are modeled using the CAD software.

Figure 1B:
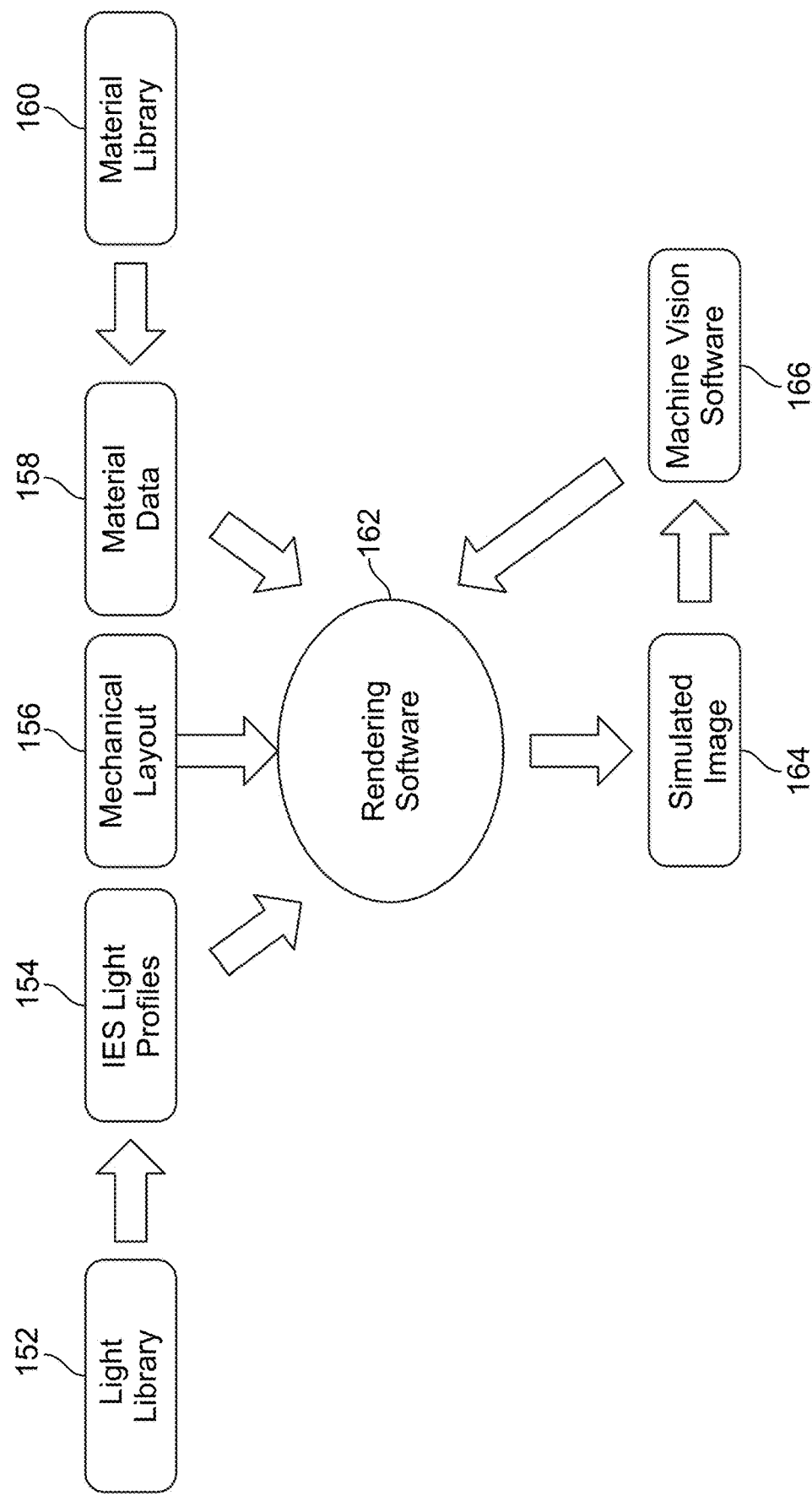
FIG. 1B illustrates a block diagram of functional components of a system in accordance with the principles of the present disclosure.

FIG. 1B illustrates a block diagram of functional components of a system for simulating a computer vision based inspection station in accordance with the principles of the present disclosure. A library of light mappings 152 can be available from which a designer can select particular light mappings 154, as described below, to include in the modeled inspection station. There is also a library of material mappings 160 from which the designer can select particular material mappings 158, as described below, to include in the modeled inspection station and/or the modeled part or product to be inspected. As mentioned, the CAD software can be used to design the structure of and layout 156 of the inspection station 100. The light mappings 154, the model layout 156 and the material mappings 158 are used by image rendering software 162, as discussed further below, to generate an image from the perspective of a camera in a virtual inspection station imaging a virtual part or product to be inspected. A "modeled inspection station" is intended to mean an inspection station having the physical structure and layout of the components of the inspection station 100 simulated and a "modeled part" is intended to mean a part having its structure or make-up simulated. The "virtual inspection station" is intended to mean the modeled inspection station with corresponding light and material mappings applied to the modeled lights and one or more modeled components and the "virtual part" is intended to mean the modeled part with one or more corresponding material mappings applied to its structure.

Software rendering is the process of generating an image from one or more models by means of computer software. As described above, a computer aided design (CAD) software is used to model and layout all the components of the inspection station 100 and the part or product to be inspected. This can include, but is not limited to: an imaging sensor (i.e., camera), the part or product being inspected, any lights or optics, any mechanical fixturing, and other structure of the inspection station 110, such as its housing. All the models collectively can be referred to as a scene. Once a functional layout of the inspection station and the part or product is created in the CAD software, it can be imported into rendering software 162 where light and material mappings are applied to the lighting and workpiece models. The rendering software 162 then creates a simulated image from the perspective of the camera in the simulated or virtual inspection station and can be manipulated to look as accurate to true life as possible. Example commercially available CAD software includes NX by Siemens and Solidworks by Dassault Systemes. Example commercially available rendering software includes Keyshot by Luxion. The rendering software 162 produces a simulated image 164. The simulated image 164 is intended to depict a physical image that would be captured by a camera if the virtual inspection station and virtual part or product were to be actually implemented physically. The simulated image 164 can then be provided to a computer vision system or software 166 for image analysis. In terms of the simulated or virtual workpiece inspection station and product or part, the image analysis may be performed to identify or recognize the presence of one or more features or patterns corresponding to one or more attributes of the product or part in the simulated image, which attributes are intended to be inspected on parts to be later built and inspected and may comprise a product edge, a product corner, a product surface feature, a specific part on or portion of the product, and other attributes on the product, one or more two-dimensional logos, one or more three-dimensional logos, and combinations of one or more of these. This same computer vision system or software 166 receives real images generated by a camera at an inspection station actually implemented physically to inspect actual products or parts to determine if those products or parts have defects or imperfections. One example commercially available computer vision software 166 is Cognex In-Sight Explorer.

The CAD software, the rendering software 162, and the computer vision software 166 can each be executed on a separate computer system or processor or, alternatively, one or more of the different software applications can be executed on the same computer system or processor. One of ordinary skill will readily recognize that the computer system(s) can be a single processor or a multi-processor system without departing from the scope of the present invention.

Figure 2A:
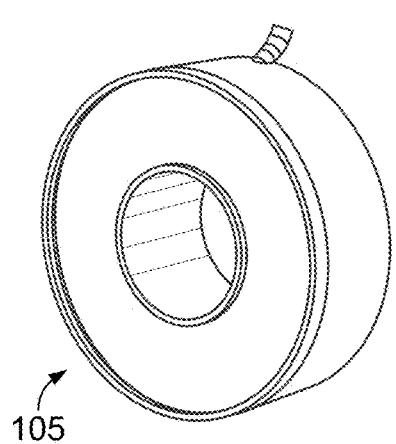
FIG. 2A and FIG. 2B depict lighting models in accordance with the principles of the present disclosure.
Figure 2B:
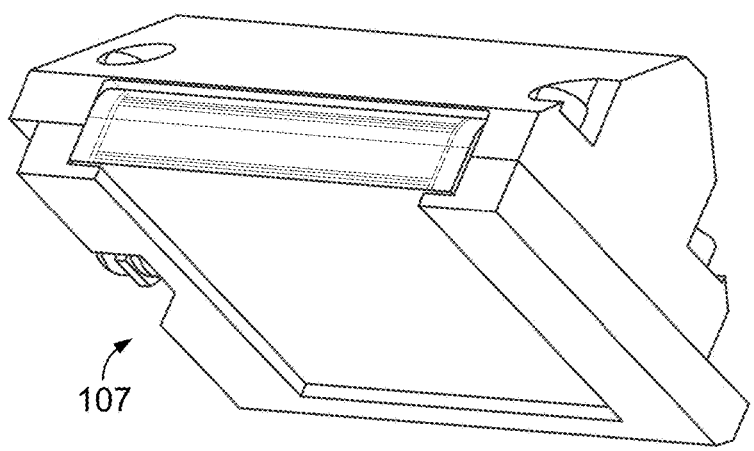

FIG. 2A and FIG. 2B depict example lighting models in accordance with the principles of the present disclosure. A lighting model, generated by CAD software, is a 3D representation of the physical dimensions and shape of a light source. FIG. 2A is an example of a model of a ring light 105 and FIG. 2B is an example of a model of a back light 107. One or more of these lighting models can be placed at different locations and oriented in different directions when a designer creates a modeled inspection station 100A, such as is illustrated in FIG. 1A, using the CAD software.

Figure 3:
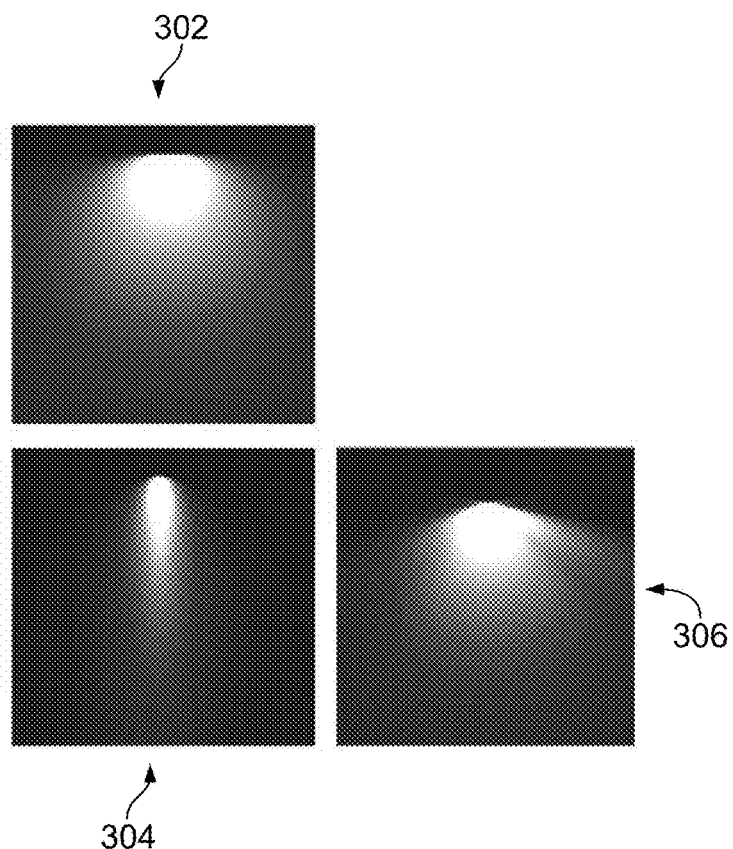

FIG. 3 depicts example light mappings in accordance with the principles of the present invention. Within a virtual inspection station, a light source is modeled with a lighting model from the CAD software and a light mapping is applied to the lighting model via the rendering software. The lighting model is positioned in a particular manner typically using the CAD software but the rendering software also has the ability to position CAD objects and/or models within its object space. The location and orientation of a light mapping is associated with the lighting model using the rendering software. Although FIG. 3 is two-dimensional in nature, a light mapping comprises three-dimensional data. In particular, a light mapping represents a three-dimensional distribution of light intensities, which can also include color and wavelength, at different distances and positions surrounding the origin of the light source.

Figure 4A:
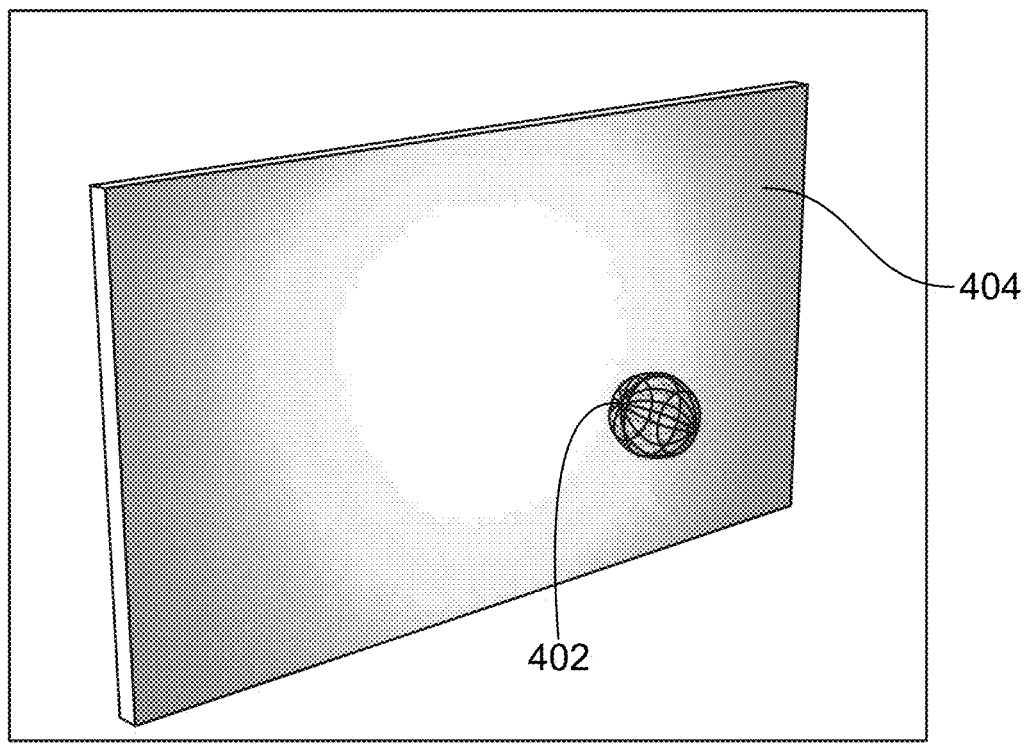
Figure 4B:
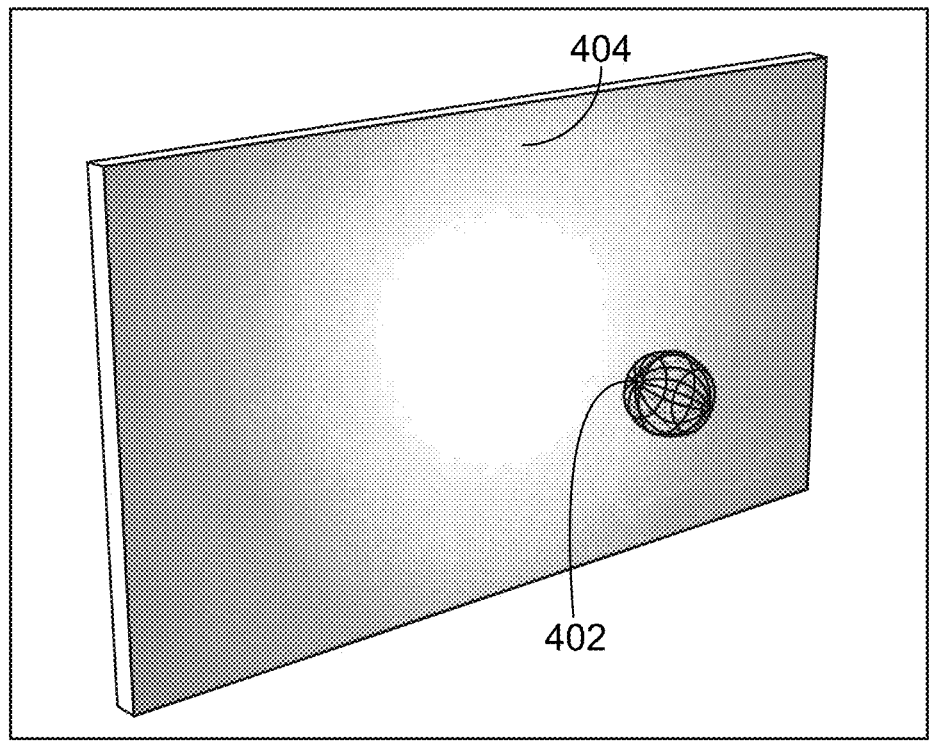

A light mapping can be derived by measuring the light intensity at different positions/locations around a physical light source. Light mappings are typically provided by rendering software. One example first light mapping 302 represents a more diffuse light source than an example second light mapping 304, see FIG. 3. An example third light mapping 306 is similar to that of the first light mapping 302 but has a lower intensity and a more irregular shape. Thus, light mappings represent both the manner, i.e., scope, shape and size, in which the modeled light source projects light and the intensity at which the light is projected. FIGS. 4A and 4B illustrate how a designer can adjust or change a light mapping for a particular light source and lighting model using the rendering software. The origin 402 of the light source is positioned relative to a modeled flat planar surface 404 and light defined by a light mapping is projected onto that surface. In FIG. 4A, the light mapping is representative of first color (yellow) of light being projected onto the surface 404 and the light mapping of FIG. 4B is representative of a different color (green) of light being projected onto the surface 404.

Figure 5B:
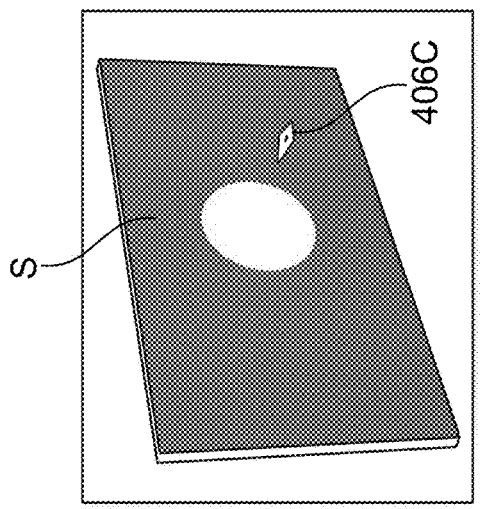
Figure 5E:
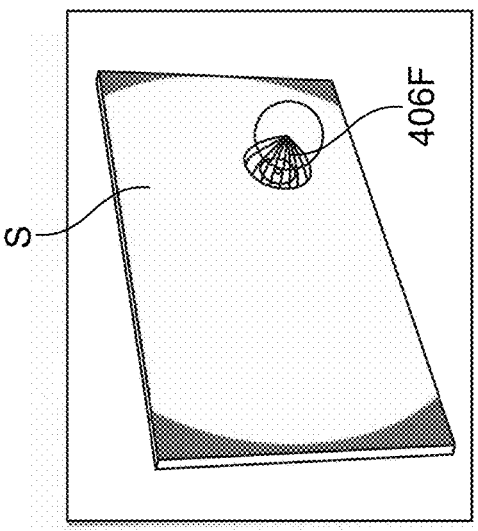
Figure 5B:
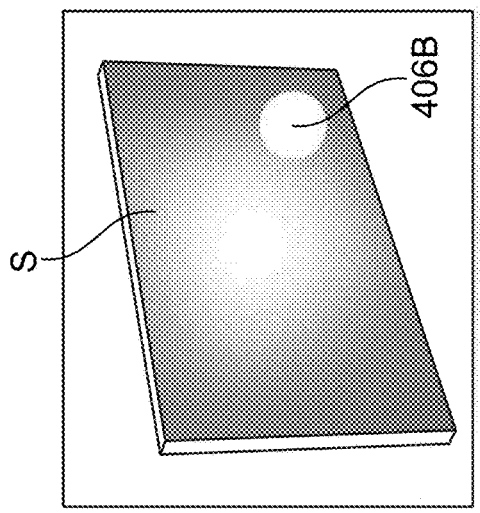
Figure 5E:
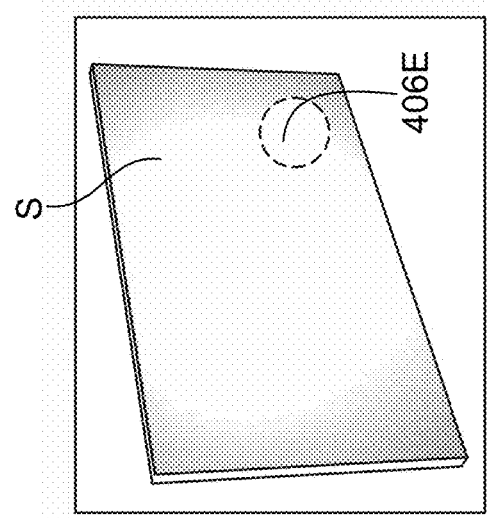
Figure 5A:
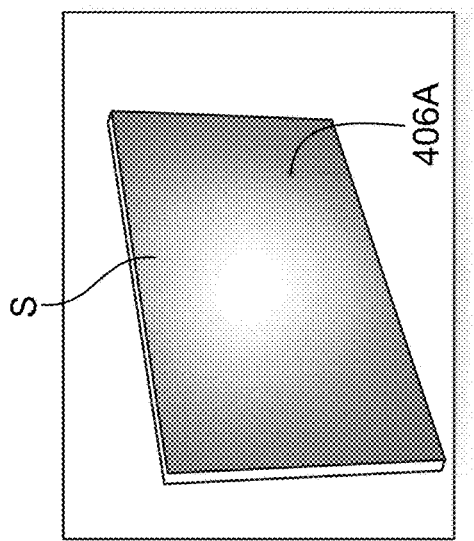
Figure 5D:
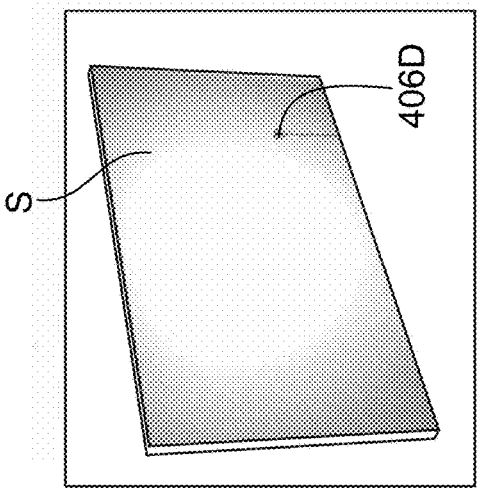

FIGS. 5A-5F depict other examples of light mappings being projected onto a modeled flat planar surface S. FIG. 5A depicts the result of a light mapping for a dim point light 406A being projected onto the surface S, FIG. 5B illustrates the result of a light mapping for a relatively dim area light 406B being projected onto the surface S, FIG. 5C depicts the result of a light mapping for a small diameter spot light 406C being projected onto the surface S, FIG. 5D depicts the result of a light mapping for a relative bright point light 406D being projected onto the surface, FIG. 5E depicts the result of a light mapping for a bright area light 406E being projected onto the surface S, and FIG. 5F depicts the result of a light mapping of a large diameter spot light 406F being projected onto the surface S.

Figure 6A:
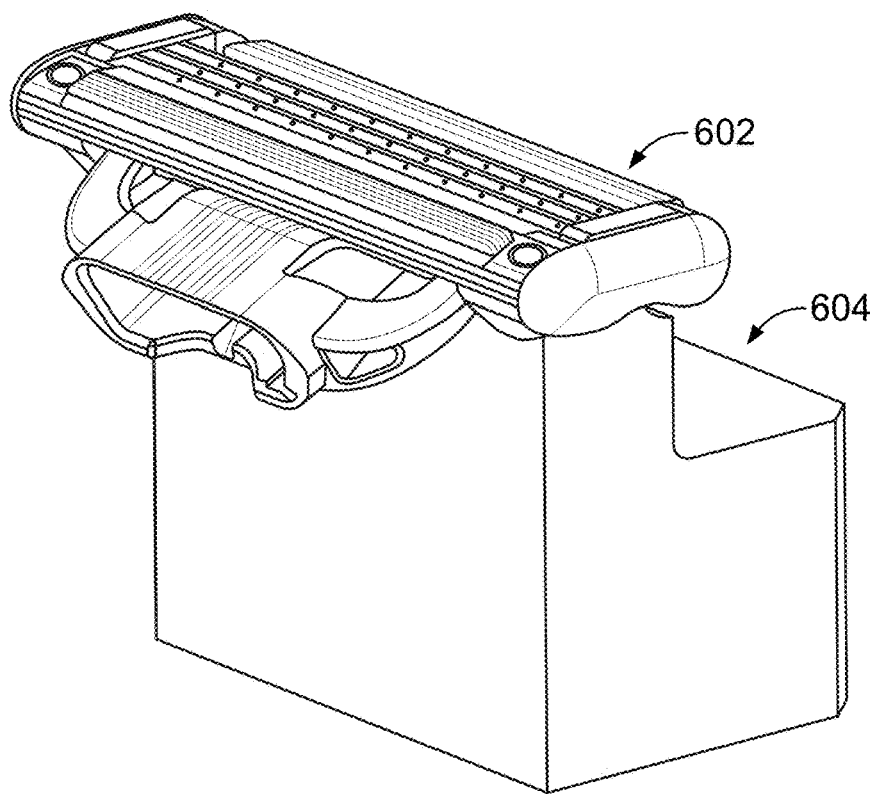
FIG. 6A and FIG. 6B depict a workpiece model in accordance with the principles of the present disclosure.
Figure 6B:
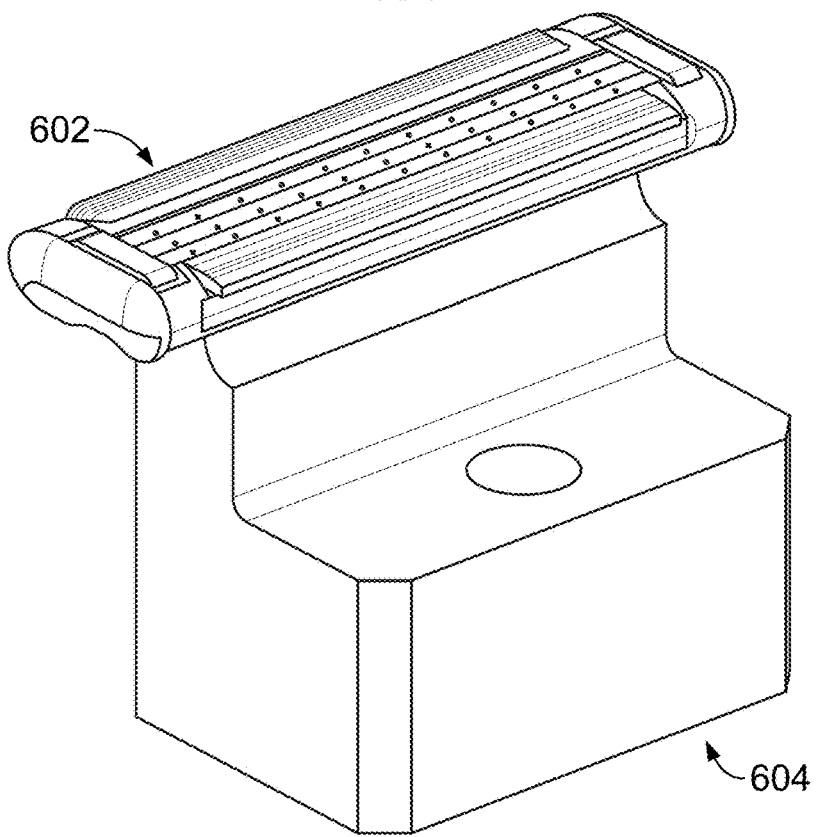

FIG. 6A and FIG. 6B depict an example of a workpiece model in accordance with the principles of the present disclosure. In FIG. 6A, a workpiece 602, a razor cartridge in the illustrated embodiment, and a fixture 604 to hold the workpiece 602, are modeled. As mentioned above, a designer can use conventional CAD software to create models of a workpiece and the fixtures that hold the workpiece in the modeled inspection station 100A. As is known in the art, a CAD model is a 3D model of the physical shape and dimensions of the object being modeled. FIG. 6B depicts another view of the modeled workpiece 602 and fixture 604.

Along with the model of the workpiece, a material mapping can be defined which represents the optical characteristics of the corresponding material to be assigned or applied to the workpiece. The material mapping defines such attributes as a color of the material, a light absorptivity of the material, light dispersion characteristics of the material, light reflectivity of the material, light transmissive characteristics of the material and a texture of the material. In general, a material mapping is selected and applied to a modeled object's surface by the designer using the rendering software and defines how light which strikes the modeled object's surface to which the material is applied would be perceived by a viewer or an imaging device. Conventional rendering software provides a designer with the tools to define various material mappings and associate those mappings with different surfaces of a modeled object. Material mappings may also be applied to models of fixtures and portions of the inspection station, such as the housing.

Figure 7C:
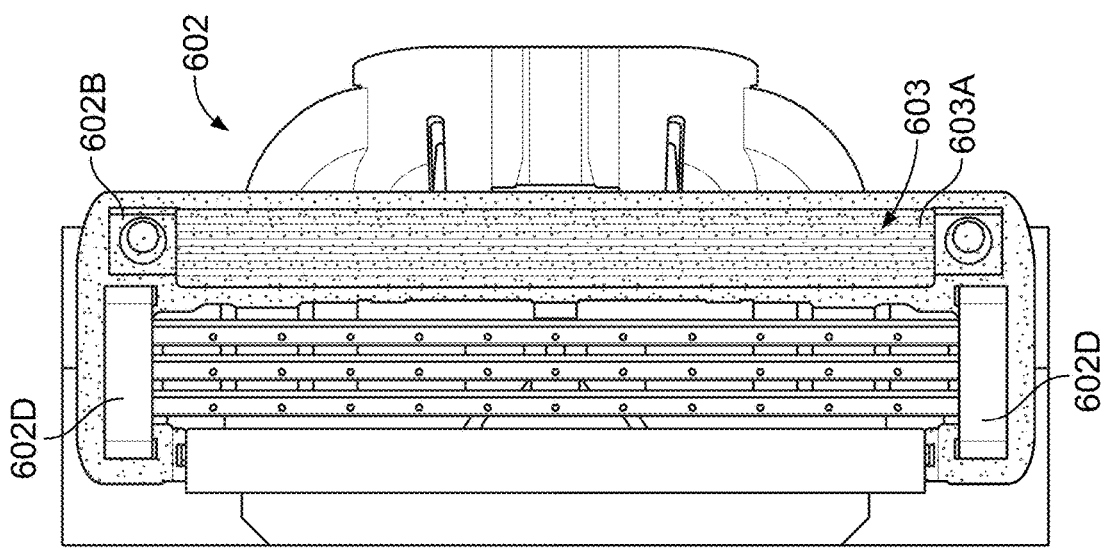
FIGS. 7A-7C depict different material mappings applied to a modeled workpiece in accordance with the principles of the present disclosure.
Figure 7B:
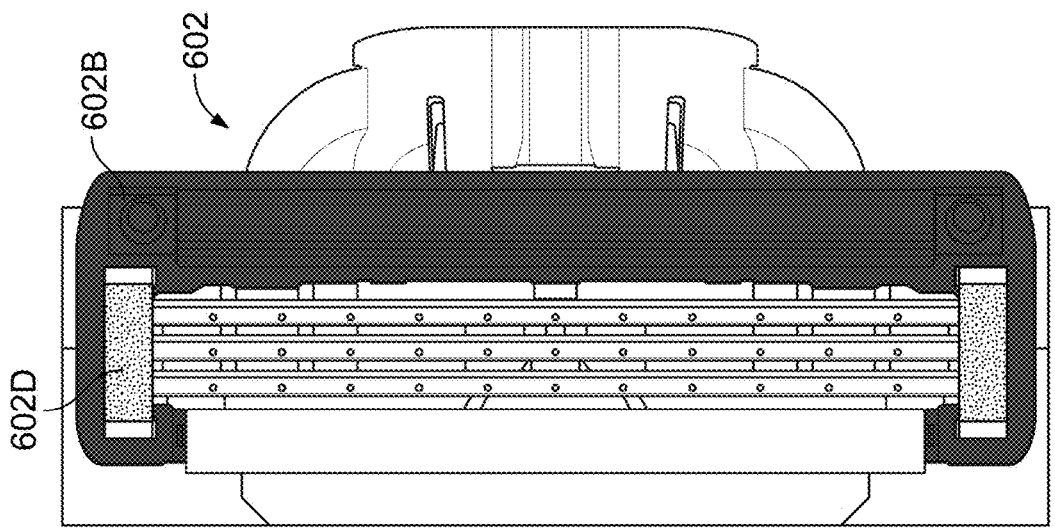
Figure 7A:
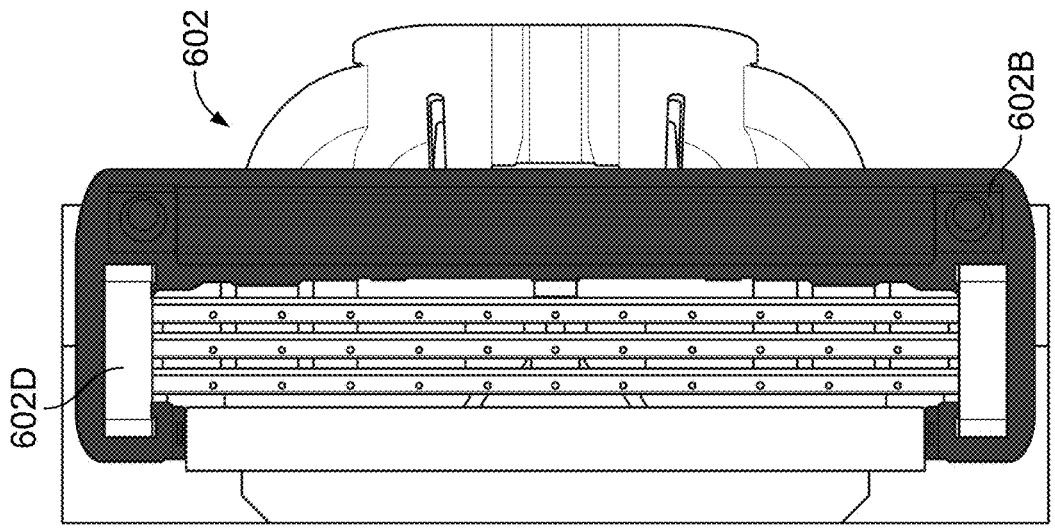

FIG. 7A and FIG. 7B depict two different material mappings applied to a clip 602D of the modeled workpiece 602 in accordance with the principles of the present disclosure. In FIG. 7A, the modeled razor cartridge 602 has a black plastic material mapping applied to its housing 602B and a light grey, smooth material mapping applied to its clips 602D. In FIG. 7B, the modeled razor cartridge 602 also has a black plastic material mapping applied to its housing 602B but a light grey, rough material mapping applied to its clips 602D. One result of a rougher surface is that it diffuses light more than a smoother surface making the rougher surface appear to be darker. Hence, the clips 602D appear darker in FIG. 7B than in FIG. 7A. In FIG. 7C, the housing 602B of the molded razor cartridge has a different color material mapping than that of the housing 602B in FIGS. 7A and 7B. One result of the difference in color may be that the fins 603A in the fin guard portion 603 of the housing 602B may be easier for the computer vision software to detect.

As mentioned, the CAD software can be used to design the mechanical layout 156 of the inspection station 100. The light mappings 154, the model layout 156 and the material mappings 158 are used by the rendering software 162 to produce the simulated image 164. The computer vision software 166 is then used to analyze the simulated image.

Figure 8A:
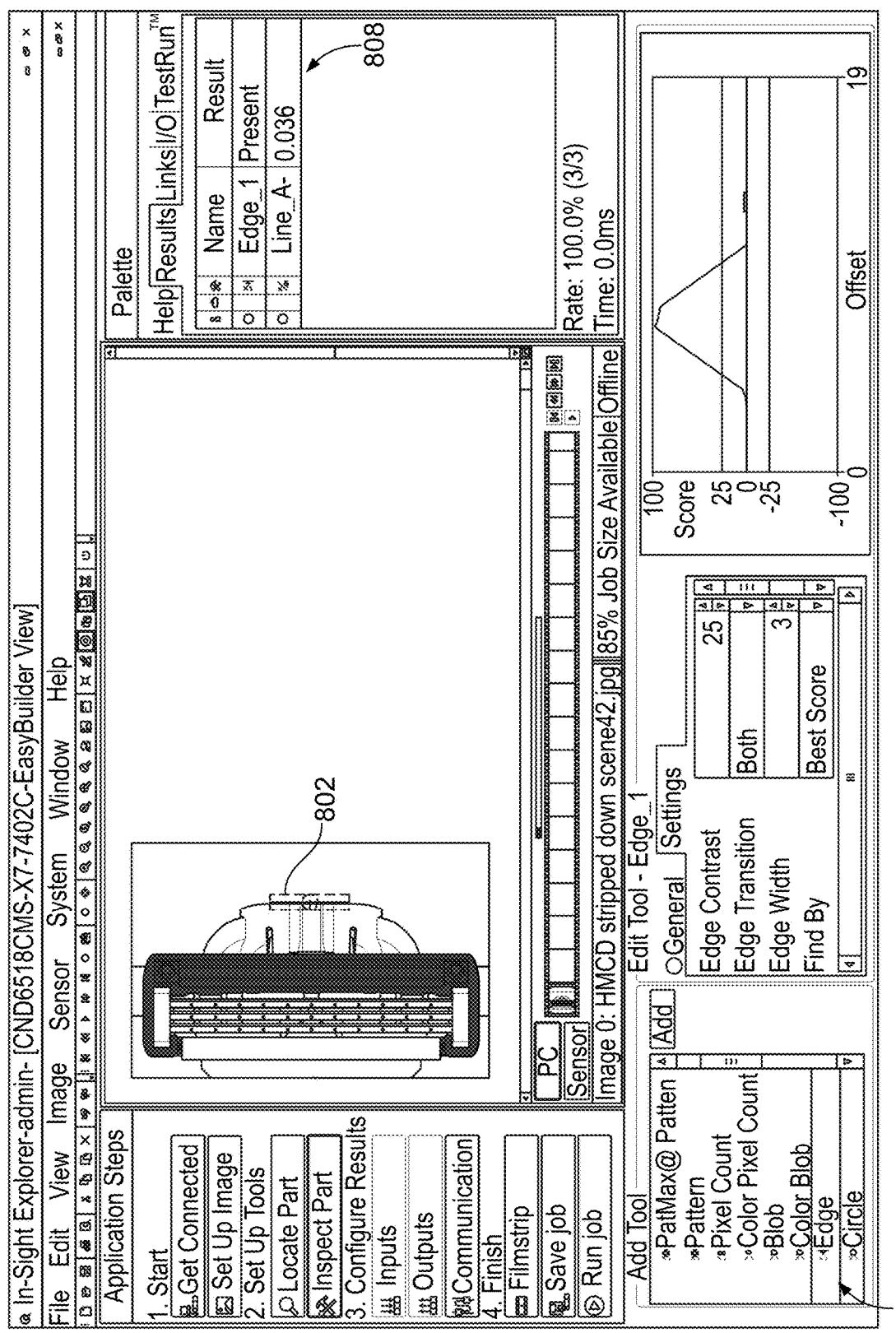
FIGS. 8A-8F depict an example user interface of computer vision software in accordance with the principles of the present disclosure.

FIGS. 8A-8F depict an example user interface 800 of the computer vision software 166 in accordance with the principles of the present disclosure. One feature of the computer vision software is that it allows a user to select and define one or more regions of interest within the simulated image, so as to limit a search area within the simulated image to only the defined one or more regions of interest. In FIG. 8A, a region of interest is defined by an outline of a box 802. The user also selects a detecting tool for seeking or finding a desired type of searchable feature in the simulated image using a menu 806. Example searchable features can be circles, lines, edges, patterns, and any other types of features that the computer vision software provides for. In this example, an edge detecting tool is selected causing the computer vision software 166 to search for an edge in the region of interest 802 of the simulated image. The user can be provided with feedback via screen portion 808. The box 802 shows that in this simulated image, an "edge" is scored as "present." In other words, within the region of interest 802, an edge was determined to be present or identifiable. It is also contemplated that the region of interest may comprise the entire simulated image or no region of interest may be defined, which results in the entire simulated image being searched by the detecting tool. Hence, when the computer vision software searches for a feature in the simulated image, it can search for that feature in the entire image when the region of interest is designated to be the entire image or no region of interest is defined.

Another type of detection tool frequently provided in computer vision software 166 is known as a blob detection tool, which looks for clusters of pixels with similar color to confirm the presence or absence of a feature.

The computer vision software can provide a number of different feature detection tools with each one having different settings configurable by a user. These settings allow the user to control how the computer vision software determines whether or not a particular feature is detected, or is identifiable, in a simulated image. For example, an edge detection tool may allow a user to define a contrast threshold value such that the occurrence of adjacent lines of pixels (each line of pixels having a predefined number of linearly arranged pixels) having a contrast value which exceeds that threshold value are considered to correspond to an identifiable edge. An inspectability metric may also be provided by the detection tool corresponding to the detected contrast value for the adjacent lines of pixels. As another example, a pattern detection tool may allow the user to define a threshold value that represents a percentage (e.g., any value between 1% and 100% is possible) of matching pixels. If a region of the simulated image has an amount or percentage of pixels above the threshold percentage that match the pattern, then that pattern is considered to be identifiable in the simulated image. An inspectability metric may also be provided by the detection tool corresponding to the number or percentage of pixels found in the image that match the pattern. Each of the other feature detection tools provided by the computer vision software can have similar, respective user-definable settings that allow the user to control the determination by the computer vision software whether or not a feature is identifiable in the simulated image. The user can configure the settings based on the risk the user considers acceptable for not identifying a feature that is present or, conversely, falsely identifying a feature that is not present. It is also contemplated that the computer vision software can provide one or more feature detection tools having a fixed threshold value, which the detection tools use to determine if a feature is detected in a simulated image. For example, a line detection tool may use a threshold value of 20 adjacent pixels aligned along a straight line when searching for a line. Hence, in order for the detection tool to indicate that a line has been detected and is identifiable, it must detect 20 linearly positioned, adjacent pixels. The detection tool may also provide an inspectability metric corresponding to the results of the search. For example, if the detection tool finds a line that is 18 pixels long, it may provide an inspectability metric comprising 18, corresponding to the number of pixels detected, or an inspectability metric comprising a 95% confidence level that the found line is the desired searchable feature. If, however, it finds a line of only 14 pixels, it may indicate an inspectability metric comprising 14, corresponding to the number of pixels detected, or an inspectability metric comprising a 50% confidence level that the found line is the desired searchable feature.

Figure 8B:
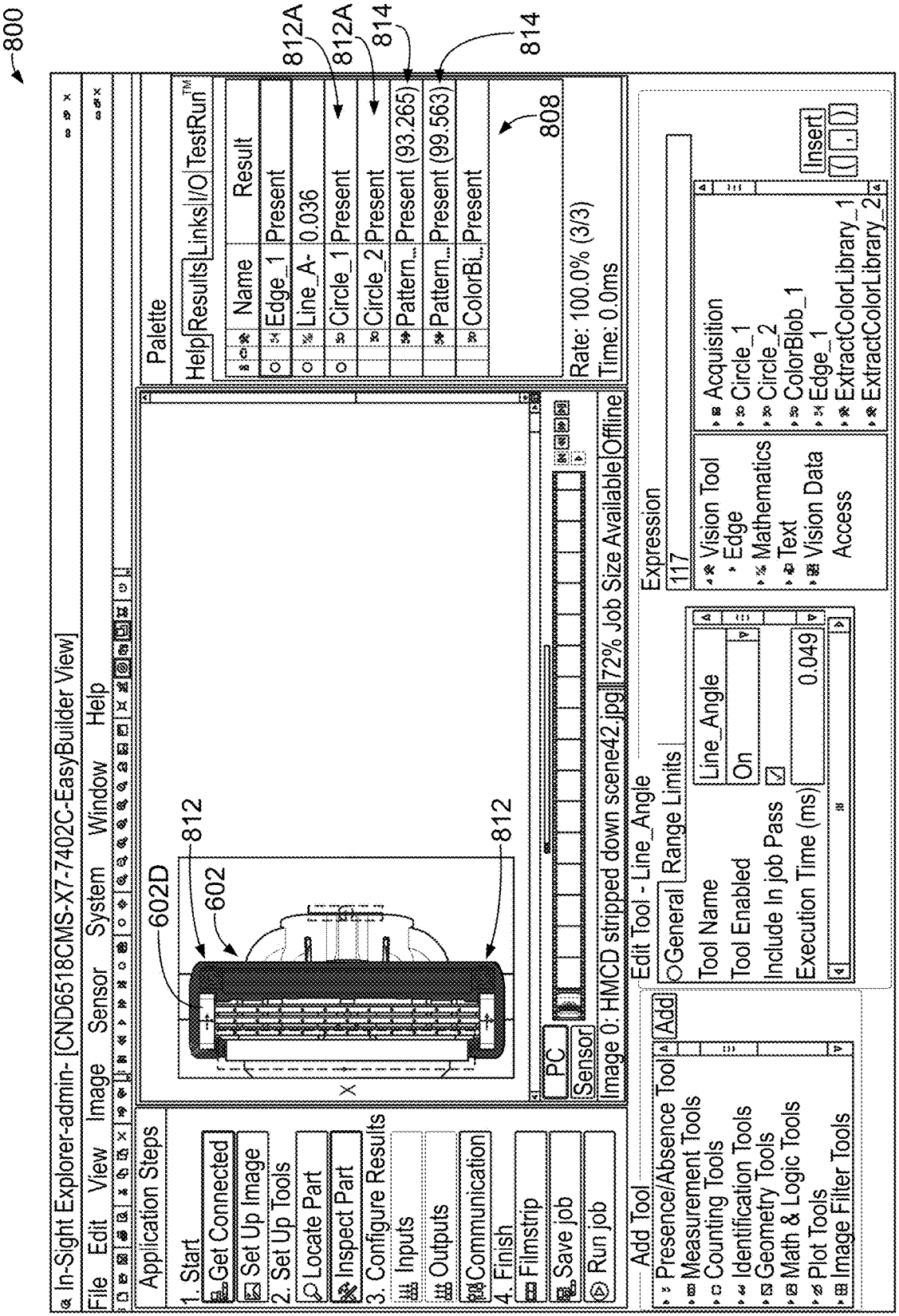

In the example of FIG. 8B, two search regions or regions of interest 812 in the shape of an annulus are defined in which to search for the presence of a circle. Also, in the example of FIG. 8B, a pattern defined by the outline of a clip 602D, see also FIG. 7B, of a razor cartridge 602 is provided to the computer vision software 166 to be used as a pattern to be searched for within the simulated image. In general, a "pattern" is an arrangement or a pattern of pixels similar to what is trying to be identified as present or not, e.g., a workpiece attribute, in the simulated image by the computer vision software 166. The pattern can be generated based on a captured image of an actual object or can be a simulated image provided to the computer vision software 166. One example of a pattern of pixels is the outline of a cartridge clip 602D. As an example, the user may specify a threshold value of 85% for a pattern detection tool that is used to search a region of interest in the simulated image for pixels that match the pattern comprising the outline of the cartridge clip 602D. If an arrangement of pixels is located by the detection tool in which at least 85% of those pixels are the same as the pattern of pixels comprising the outline of the cartridge clip 602D, then that pattern is considered to be identifiable in the simulated image. An inspectability metric may also be provided by the detection tool of 85% corresponding to the percentage of pixels found in the image that match the pattern.

Another example of a pattern of pixels to search for might be a portion of a three-dimensional logo with a shadowed area. As shown in region 808, scores 812A are provided indicating that two circular areas, corresponding to molding injection ports on the razor cartridge 602 in the simulated image, were located. Also, scores 814 are provided indicating that two instances of the pattern defined by the razor cartridge clip were located within the simulated image by the computer vision software 166. In this example, the pattern was determined to be present at one location in the simulated image with a confidence level of 93.265% and the pattern was determined to be present at a second location in the simulated image with a confidence level of 99.563%. The confidence level may define an inspectability metric. Hence, the computer vision software 166 allows the user to identify or define one or more patterns corresponding to one or more attributes of a workpiece, wherein the computer vision software 166 searches for those one or more patterns in the simulated image. The computer vision software 166 may search for a pattern in a defined region of interest or, if a region of interest is not defined, in the entire simulated image. More specifically, the computer vision software 166 applies image analysis techniques to determine whether or not there are a group of pixels of the simulated image that match the selected pattern. Hence, the selected or defined pattern can beneficially correspond to one or more attributes of a workpiece that are to be inspected if the modeled inspection station were physically implemented. When the confidence level of a match of the selected pattern is above a user-definable threshold value, e.g., any value between 1 and 100%, preferably any value greater than 50% and more preferably any value greater than 70%, then that corresponding workpiece attribute is considered to be "identifiable" in the simulated image.

Hence, a threshold value for determining whether a feature or pattern is present or identifiable is either predefined by the computer vision software or configurable by the user.

While "pattern" is defined herein as a pattern of pixels, it is intended that use of the term "feature" in the claims encompasses a "pattern" as well as circles, lines, edges, and any other types of features for which the computer vision software allows to be searched.

Figure 8C:
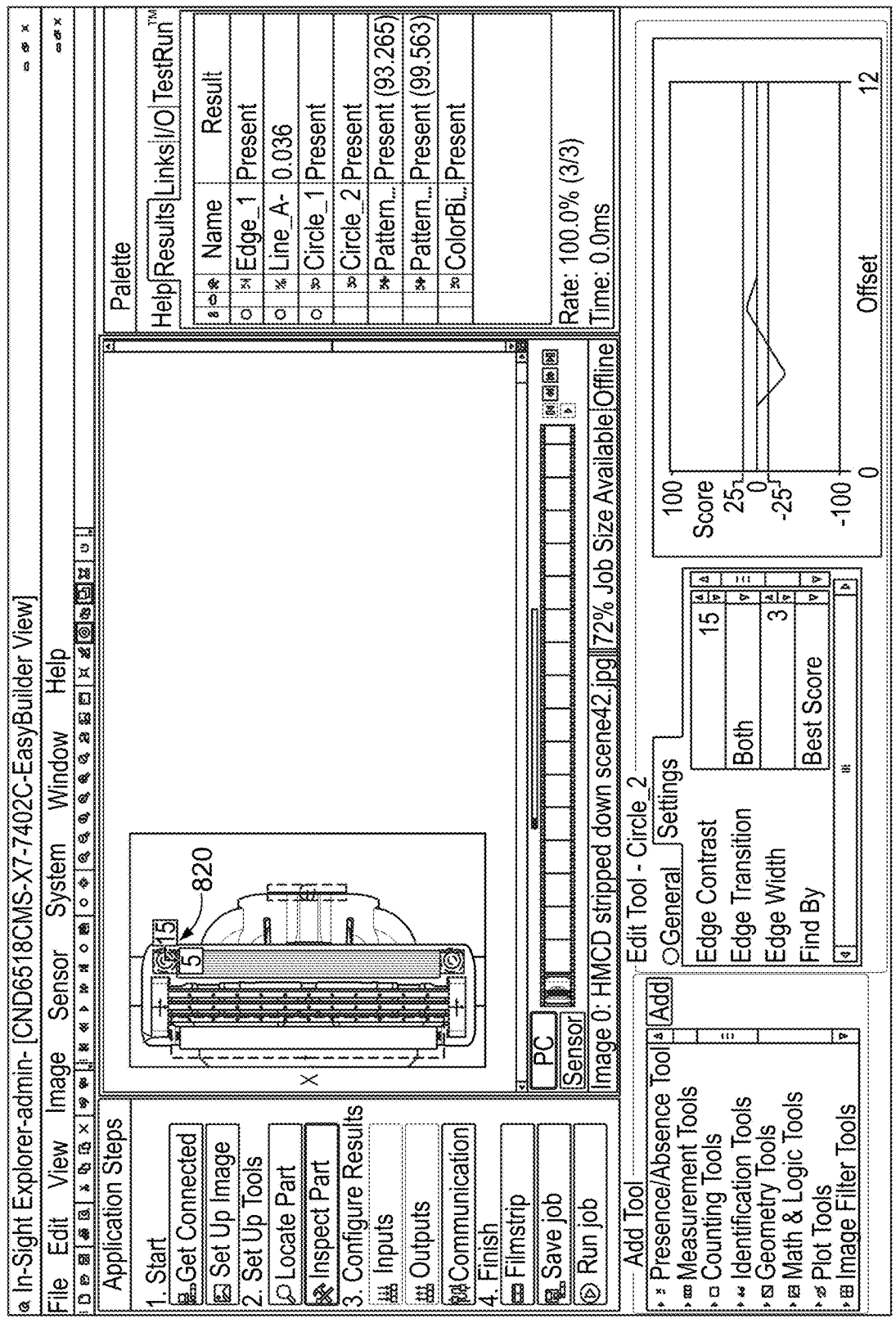
Figure 8D:
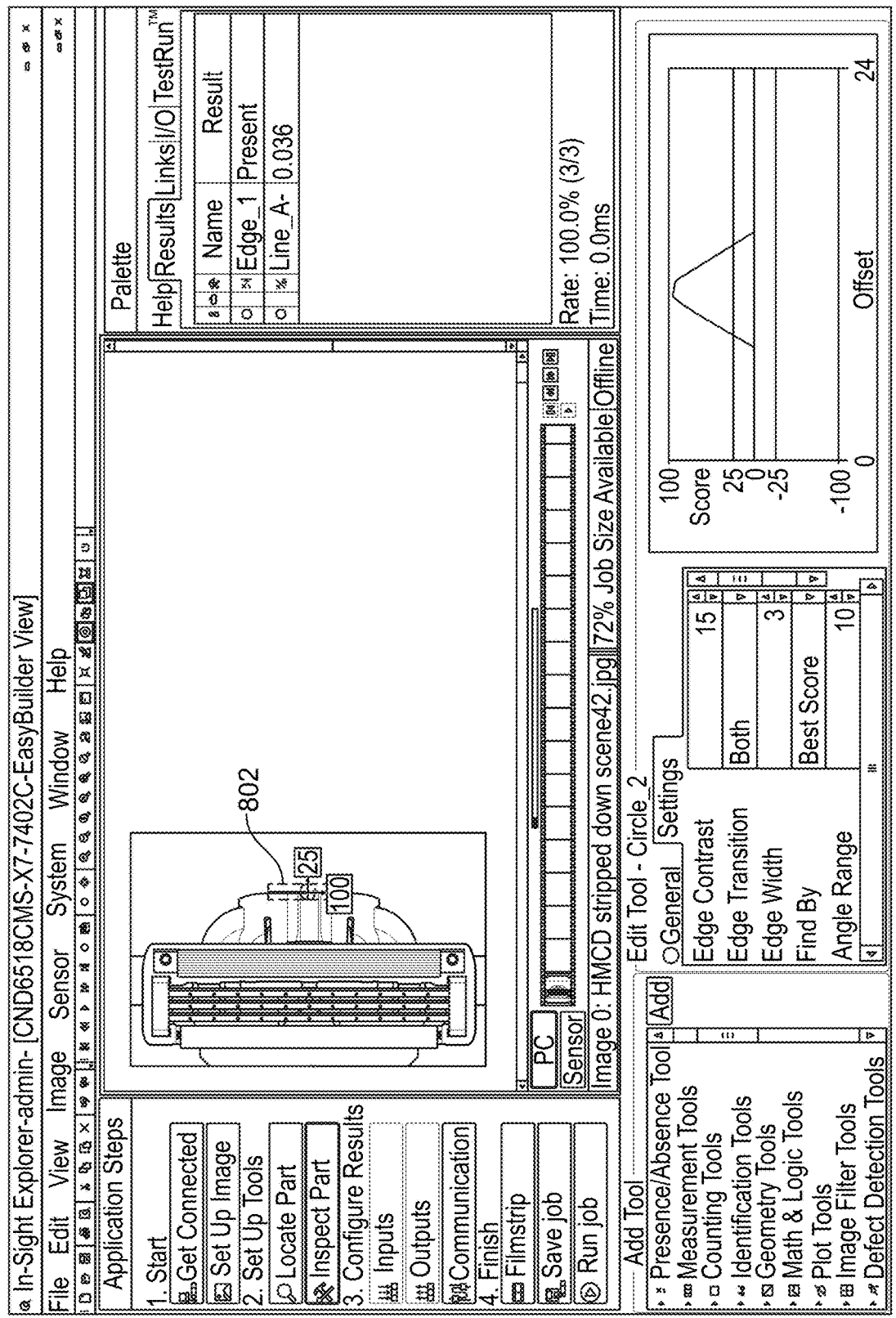
Figure 8E:
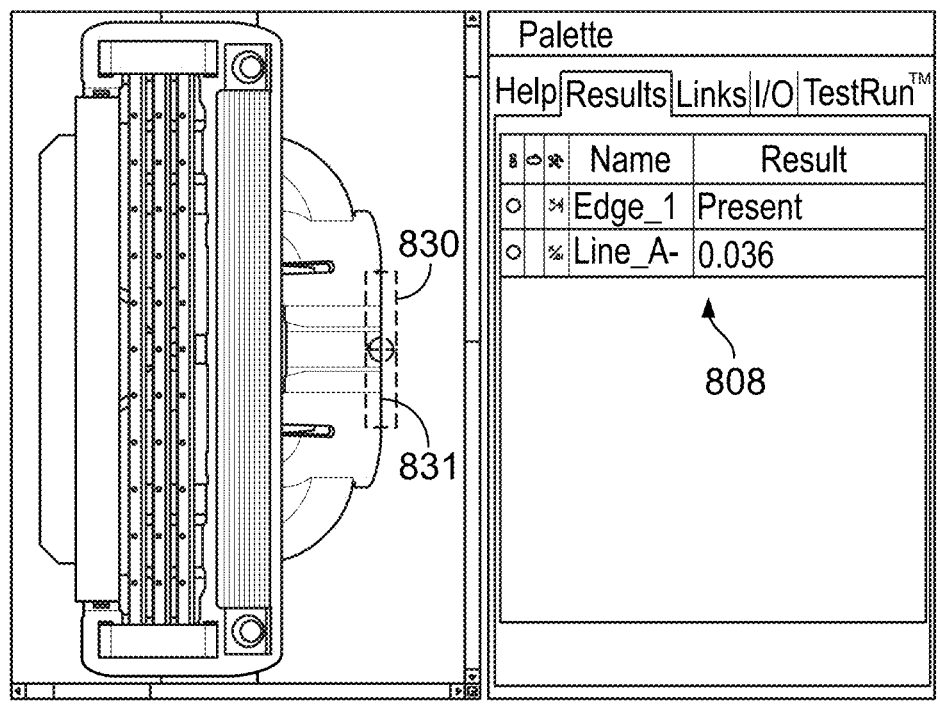
Figure 8F:
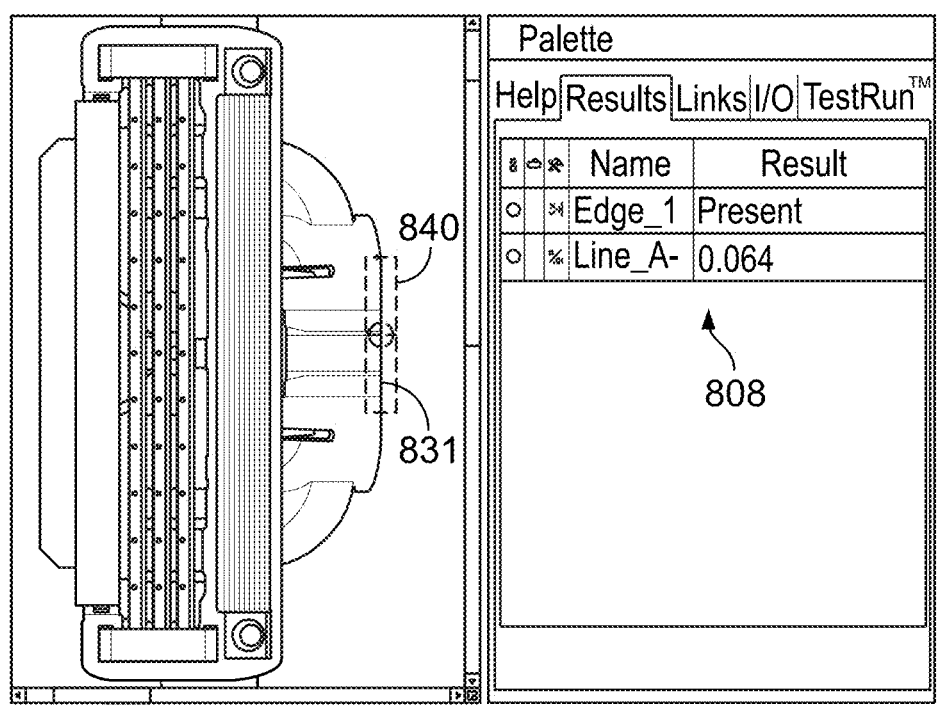

FIG. 8C is an example of a user changing the size of the region of interest 820 in which to search for a circle. FIG. 8D is an example of a user changing the size of the box region of interest 802 in which to search for an edge. Changing the size and/or position/location of the region of interest can have an effect on the computer vision software's analysis of the same simulated image as the area being searched is changed. In FIGS. 8E and 8F, the positions of the regions of interest 830 and 840 differ slightly. Due to this change in position, an edge 831 determined to be present in the region of interest 830 has an angle relative to vertical of 0.036 degrees, while that same edge 831 in the region of interest 840 has an angle relative to vertical of 0.64 degrees, see screen portion 808 in FIGS. 8E and 8F.

Figure 9A:
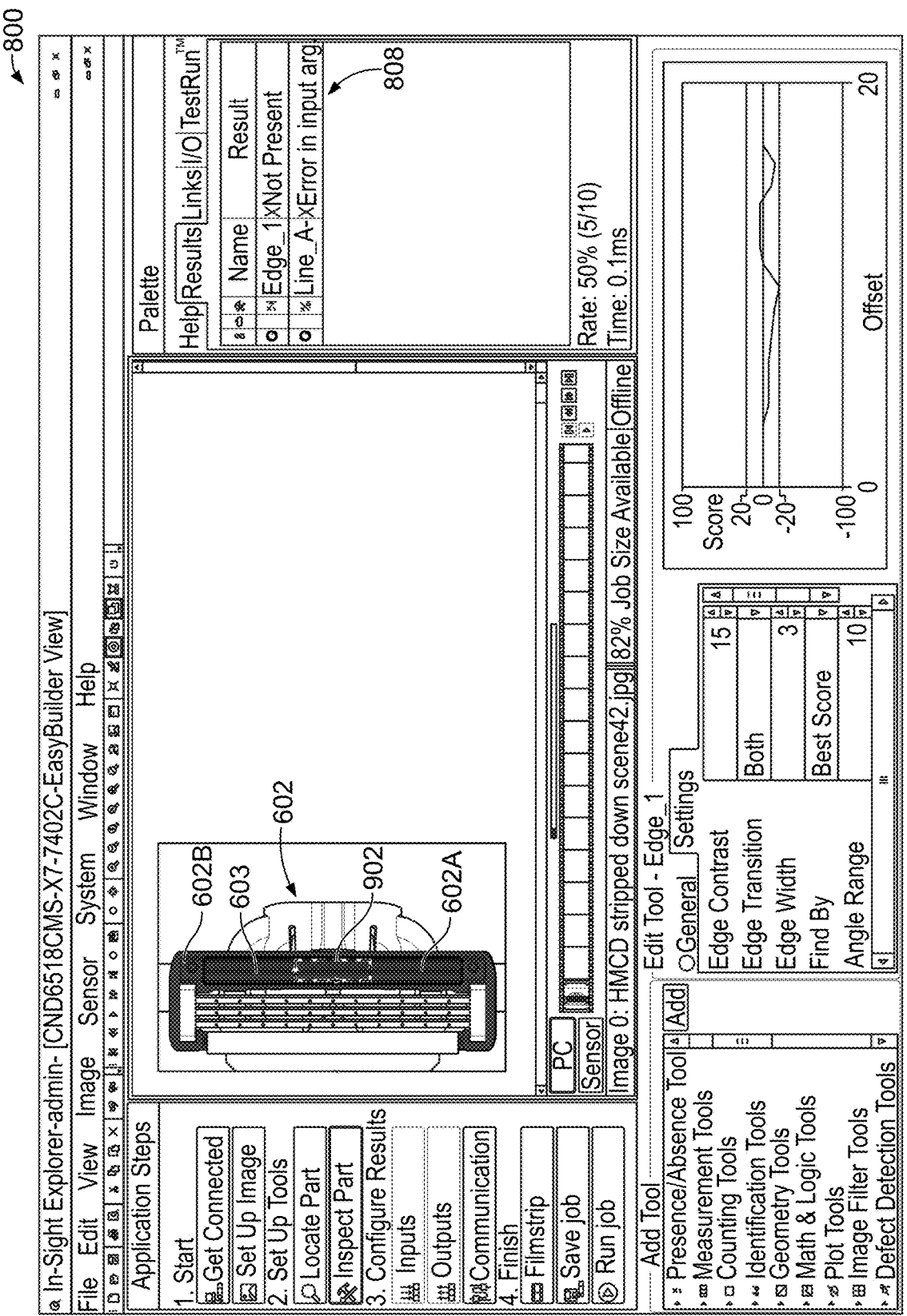
FIG. 9A and FIG. 9B illustrate how different material mapping affect discernibility of an attribute of a workpiece in a simulated image in accordance with the principles of the present disclosure.
Figure 9B:
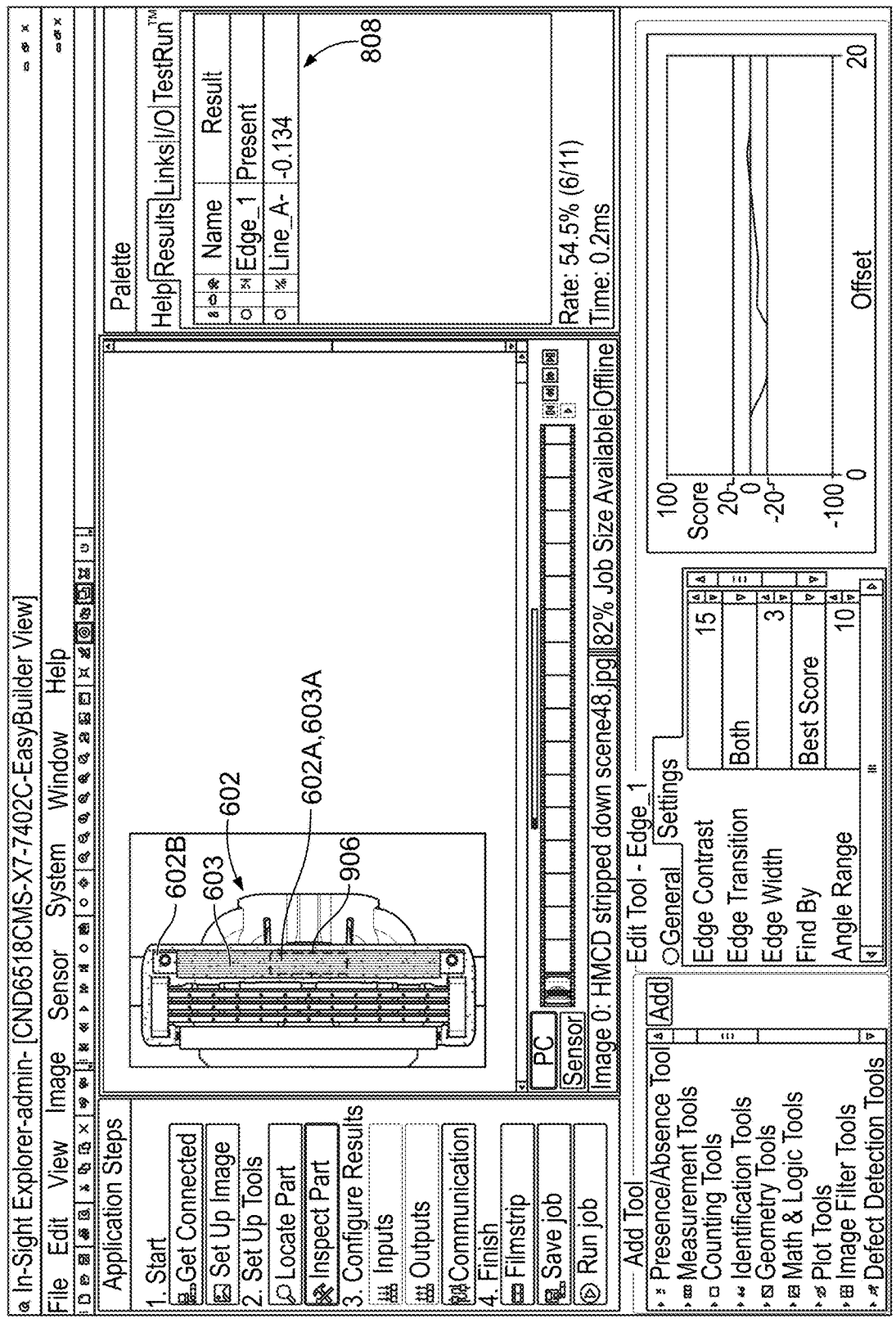

As noted above, material mappings are applied by the rendering software to a portion of a modeled workpiece or workpiece holder. These different material mappings 158 can affect how discernable a feature corresponding to a workpiece attribute is within a region of interest in a simulated image. In FIG. 9A and FIG. 9B, the region of interest 902 and the region of interest 906, respectively, are placed over a fin guard 603 of a housing 602B of the razor cartridge 602, see also FIG. 7B. In FIG. 9A, the material mapping defines the color of the housing to be black. In FIG. 9B, a different material mapping defines the color of the housing to be green. In FIG. 9A, the edge-finding tool does not detect an edge in the region of interest, see screen portion 808 in FIG. 9A. However, in FIG. 9B, the edge-finding tool does find an edge 602A of a fin 603A to be present, see screen portion 808 in FIG. 9A, as the fins 603A on the fin guard 603 are much clearer and more easily detectable in the simulated image of FIG. 9B where the material mapping is a color (i.e., green) other than black.

Utilizing the CAD software, the rendering software 162 and the computer vision software 166 described above, a user can simulate different configurations of an inspection station and product or part in an entirely virtual manner. The virtual workpiece may have a variable design parameter defined as a variable workpiece parameter. The variable workpiece parameter may have a number of different possible instances, wherein any one of those instances could be selected for use in a particular design or configuration of the virtual workpiece. Each instance may have a corresponding workpiece model and material mapping. For example, a first instance may comprise a first workpiece model having a first shape and size and a first material mapping having a first color and a first texture. A second instance may comprise a second workpiece model having a second shape and size different from the first shape and size and a second material mapping having a second color and second texture different from the first color and first texture.

The virtual inspection station may also have variable design parameters defined as a variable illumination parameter, a variable workpiece fixture parameter, a variable camera parameter, a variable optics parameter and the like. Each variable parameter may have a number of different possible instances, wherein any one of those instances could be selected for use in a particular design or configuration of the virtual inspection station. For example, each instance of the illumination parameter may comprise one or more lighting models and one light mapping corresponding to each of the one or more lighting models. A first instance of the illumination parameter may have a first lighting model having a first shape and size for a first light source and a corresponding first light mapping having a first light intensity. A second instance of the illumination parameter may have a second lighting model having a second shape and size for a second light source and a corresponding second light mapping having a second light intensity different from the first light intensity. A third instance of the illumination parameter may have the second lighting model having the second shape and size for the second light source and a corresponding third light mapping having a third light intensity different from the first and second light intensities as well as the first lighting model having the first shape and size for the first light source and a corresponding second light mapping having the second light intensity. A first instance of a workpiece fixture parameter may comprise a first workpiece fixture model and a first material mapping having a third color and texture. A first instance of a camera model may comprise a first camera model having a first resolution.

Another design parameter comprises the relative positions of the camera model, the lighting models, the workpiece and workpiece fixture models within the inspection station, wherein the relative positions can be changed in various instances of this parameter.

One or more instances of these parameters may be changed to create and simulate different configurations of the virtual inspection station and workpiece such that the different configurations can be evaluated to determine which configuration(s) is helpful in inspecting a workpiece to determine whether or not a feature or pattern corresponding to a particular attribute of the workpiece would be discernable if the virtual inspection station and workpiece were to be physically implemented. Thus, embodiments in accordance with the principles of the present disclosure relate to a method for evaluating a design of a configurable inspection station for inspecting a workpiece, wherein the design of the configurable inspection station has a plurality of changeable design parameters.

Figure 10:
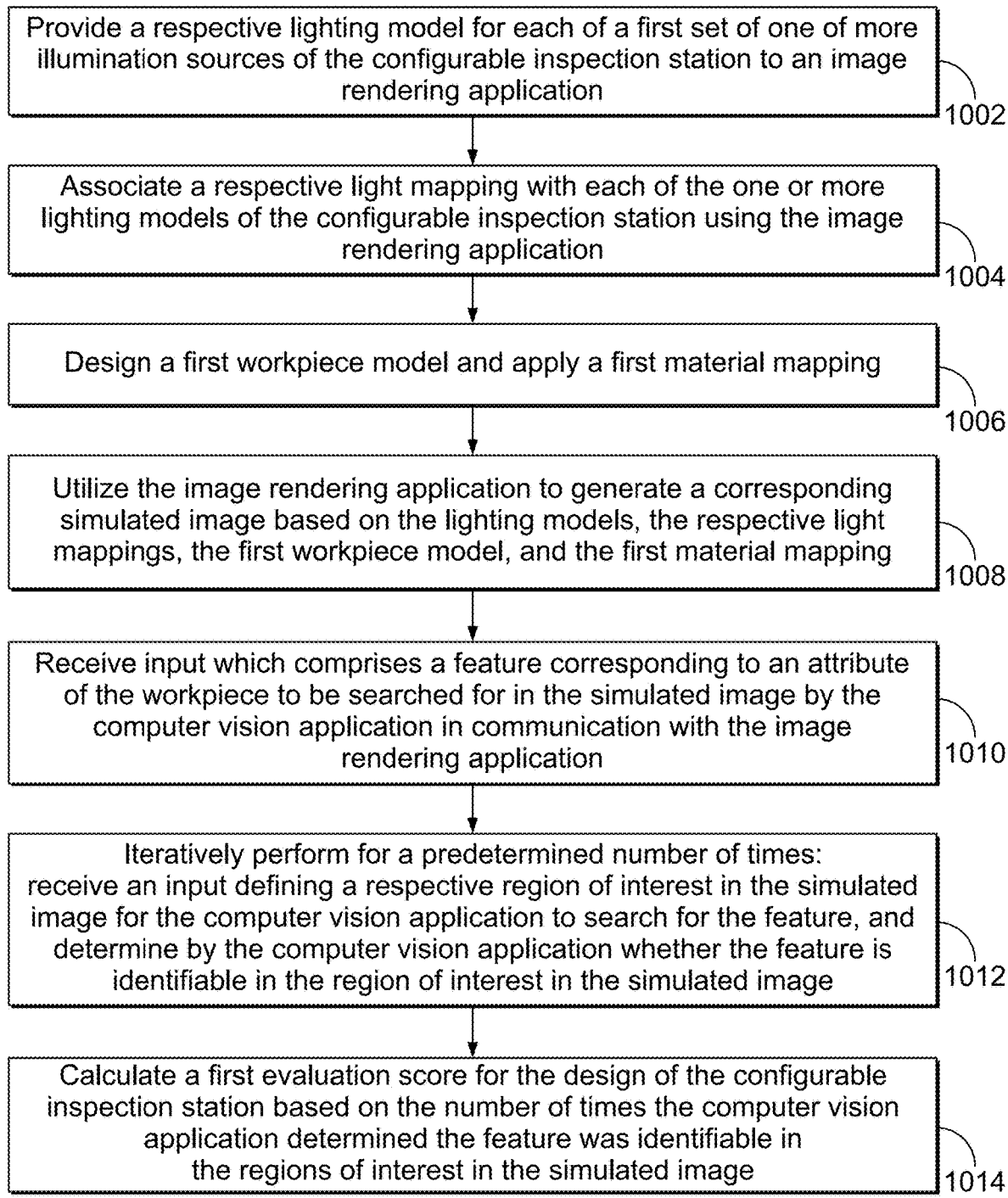
FIG. 10 is a flowchart of an example method of evaluating the design of the configurable inspection station in accordance with the principles of the present disclosure.

FIG. 10 is a flowchart of an example method of evaluating the design of the configurable inspection station. In step 1002, a user can define a desired illumination parameter instance by selecting one or more lighting models using CAD software, for example, in order to provide a respective lighting model for each of a first set of one or more illumination sources of the configurable inspection station to an image rendering application defined by the image rendering software 162. Using the image rendering software, the user can associate a light mapping with each lighting model in order to provide, in step 1004, a respective light mapping for each of the one or more lighting models of the configurable inspection station. As mentioned above, a lighting model is a representation of the size, dimensions, shape, position, and orientation of an illumination source. A light mapping represents a 3D distribution of light intensities at various locations surrounding an illumination source.

In step 1006, the user can continue to use the CAD software, for example, in order to define a desired workpiece parameter instance by designing a first workpiece model to provide to the image rendering application and select one or more first material mappings to be associated with that first workpiece model by using the image rendering application. As mentioned above, the workpiece model is a representation of the size, dimensions, shape, position, and orientation of a workpiece or a portion of a workpiece. The material mapping is applied to a surface of the workpiece and defines how that surface of the workpiece will interact with light that strikes the surface. In general, the above-noted steps of FIG. 10 allow a virtual configurable inspection station and virtual workpiece to be defined. The virtual inspection station can also include a model of the camera and one or more workpiece fixtures. The virtual inspection station also can include the relative position and orientations of all the various components of the inspection station such as those in FIG. 1A.

As a result, a simulated image can now be rendered based on the virtual inspection station and virtual workpiece. Thus, the method of FIG. 10 continues in step 1008 with the image rendering application generating a corresponding simulated image based on the lighting models, the respective light mappings, the first workpiece model, the first material mapping, the camera model and the models of the other components of the virtual inspection station.

As described above, a computer vision application defined by the computer vision software 166 can be used in which a user can define one or more searchable features or patterns to be searched for in an image. Each of those searchable features or patterns can beneficially correspond to an attribute of the workpiece. Thus, in step 1010, input, such as from a user, is received which defines a feature or pattern corresponding to an attribute of the workpiece to be searched for in the simulated image by the computer vision application in communication with the image rendering application. One measure of the design of the configurable inspection station is whether or not the modeled configuration allows the feature or pattern corresponding to the workpiece attribute to be discernable for a wide variety of users. In other words, different users of the computer vision application may have differences in how they each define or select a region of interest in the image to be searched. If a feature or pattern corresponding to a workpiece attribute is discernable for a variety of different definitions of the region of interest, then that design can be considered better than a design in which the feature or pattern corresponding to a workpiece attribute is discernable in fewer of the different definitions of the region of interest.

Accordingly, in step 1012, two operations are iteratively performed for a predetermined number of times (e.g., 100 or any number less than or greater than 100) using a same simulated image. First, an input, such as from a user, is received defining a respective region of interest in the simulated image for the computer vision application to search for the feature or pattern corresponding to the attribute and secondly, the computer vision application determines whether the feature or pattern corresponding to the attribute of the workpiece is identifiable, in the region of interest in the simulated image. As mentioned above, the computer vision system uses image analysis algorithms to determine whether the user-defined searchable feature or pattern is present in an image. Determining the user-defined searchable feature or pattern is present in the image is equivalent to determining that the attribute of the workpiece is identifiable in the simulated image.

Once the two steps of step 1012 are performed for the predetermined number of times, a first evaluation score for the design of the configurable inspection station can be calculated, in step 1014, based on the number of times the computer vision application determined the feature or pattern corresponding to the attribute of the workpiece was identifiable in the regions of interest in the simulated image. As an example, if the feature or pattern corresponding to the attribute of the workpiece was identifiable in 95 of the 100 iterations, then the first evaluation score of the design of the configurable inspection station could be 95 or 95%. One of ordinary skill will recognize that other types of evaluation scores may be used without departing from the scope of the present invention.

The method of FIG. 10 can be repeated for a different design of the configurable inspection station. One or more of the design parameter instances can be changed, such as the location of the different components. Further instances of parameters associated with the virtual inspection station and/or the workpiece can be changed including use of different lighting models, light mappings, workpiece models, and/or material mappings. A respective evaluation score can be calculated for each of the different designs of the configurable inspection station. These evaluation scores allow the different designs to be compared to determine which ones are better than others.

Furthermore, a number of attributes of the workpiece can be of interest such that a number of regions of interest and searchable features or patterns can be defined by a user in conjunction with a single simulated image. Thus, there can be feature 1, feature 2, . . . feature N for which the computer vision software can determine whether or not that feature is present in an image, wherein each feature corresponds to a respective attribute of the workpiece. Accordingly, the evaluation score in step 1014 may include a numerical component for each feature and the different numerical components can be statistically combined in various ways to arrive at an overall evaluation score associated with a particular simulated image. Thus, if there are N features searched for and there are 100 iterations of step 1012 performed, then (100×N) data points are collected that can be analyzed to determine the identifiability of the features corresponding to the workpiece attributes for a particular configuration of the modeled inspection station (i.e., one simulated image). As an example, the collected evaluation scores for different simulated images may be similar to:

| IMAGE | FEATURE_1 | . . . | FEATURE_N | SCORE |
|---|---|---|---|---|
| 1 | 95/100 | | 80/100 | 175 |
| . . . | | | | |
| 5 | 90/100 | | 90/100 | 180 |

Figure 11A:
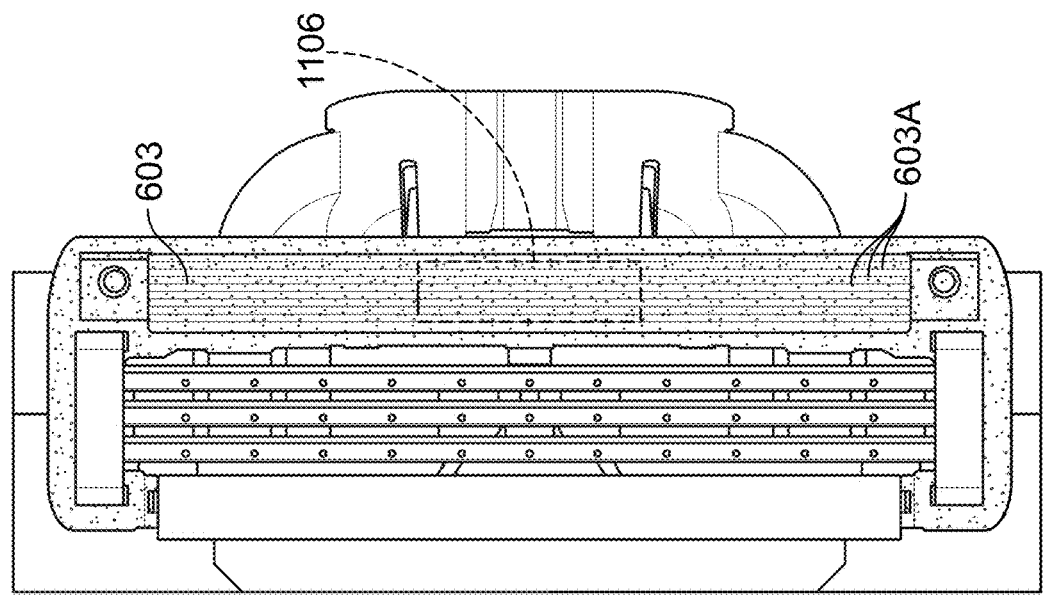
FIGS. 11A-11C illustrate how changing parameters of a configurable inspection station changes detectability of a workpiece attribute in accordance with the principles of the present disclosure.
Figure 11B:
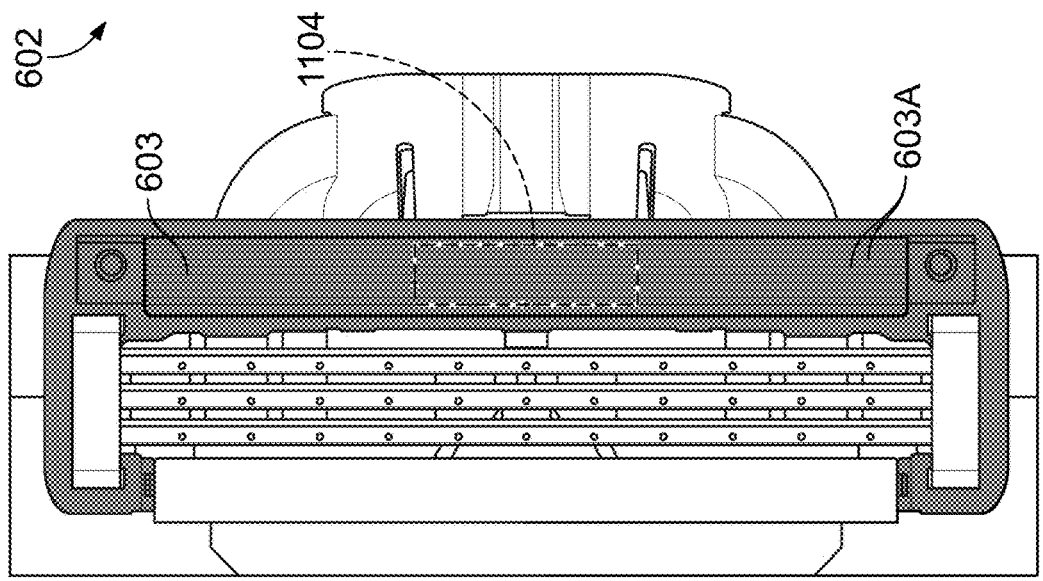
Figure 11C:
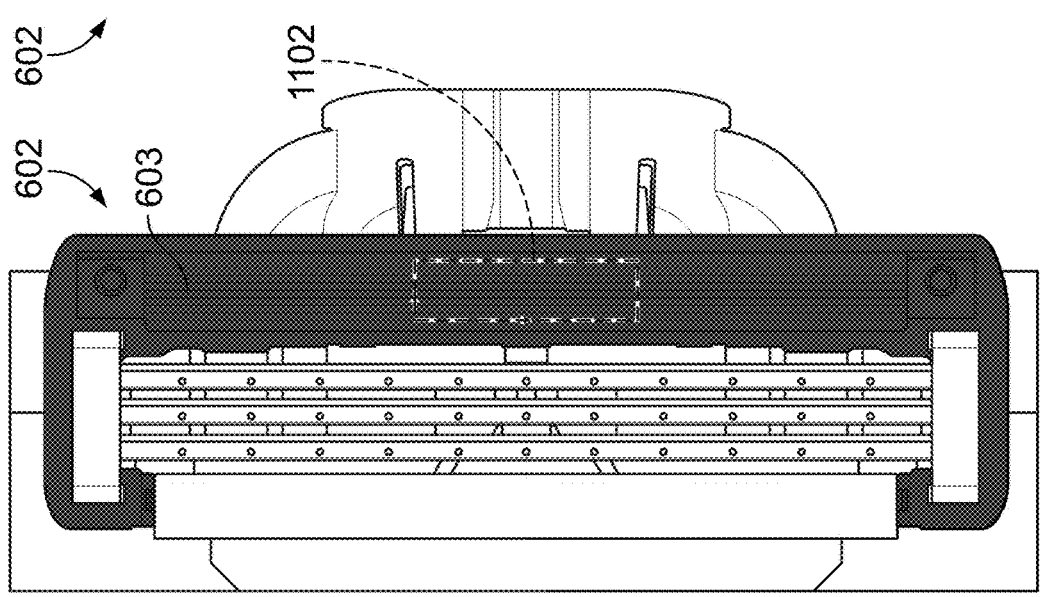

FIGS. 11A-11C illustrate how changing design parameter instances of a configurable inspection station changes detectability of a feature corresponding to a workpiece attribute in accordance with the principles of the present disclosure. In FIG. 11A, a region of interest 1102 corresponding to a portion of a fin guard 603 of a razor cartridge 602 is of interest and the feature or pattern corresponding to the attribute of the workpiece that is desired to be detected is one or more of the edges of the region 1102 corresponding to one of the protrusions or fins 603A on the fin guard 603, see FIGS. 7B and 11C. Using the software applications described earlier, the user can provide input that defines the region of interest in the simulated image and that further defines the searchable feature or pattern (e.g., an edge) that is to be searched for. FIG. 11A is a simulated image rendered using a first light mapping. This first light mapping can, for example, be changed to a second light mapping which defines a higher intensity or brightness of light as compared to the first light mapping. With this second light mapping, the rendering software can render a new simulated image as shown in FIG. 11B. In FIG. 11B, a region of interest 1104 corresponds to the same region of interest 1102 of FIG. 11A. However, with the brighter light, the one or more edges, i.e., features, corresponding to one or more protrusions or fins 603A of the fin guard 603 are more easily discernable to the computer vision application in the region of interest 1104 of FIG. 11B. Thus, the light mapping of FIG. 11B would typically be considered part of a better inspection station configuration than that of FIG. 11A, at least for inspecting the fin guard protrusions or fins 603A.

FIG. 11A is a simulated image rendered using a first material mapping, having a color such as black. Other ways that material mappings can differ is that one might represent a matte finish while another might represent a glossy finish. This first material mapping can, for example, be changed to a second material mapping which defines a different color such as, for example, green. With this second material mapping, the rendering software can render a new simulated image as shown in FIG. 11C. In FIG. 11C, the region of interest 1106 corresponds to the same region of interest 1102 of FIG. 11A. However, with the difference in color, the one or more edges, i.e., features, corresponding to one or more protrusions or fins 603A on the fin guard 603 are more easily discernable to the computer vision application. Thus, the material mapping of FIG. 11C would typically be considered a better choice and part of a more preferred inspection station configuration and workpiece configuration than that of FIG. 11A, at least for inspecting the fin guard 603.

FIG. 11B is a simulated image rendered using a light source located at a first location. As mentioned above, the image rendering software can be provided with what is considered a mechanical layout model assembly of the configurable inspection station and workpiece. By way of example, the mechanical layout model assembly can include one or more of: a camera model, the workpiece model, a fixture model, other optical component models, or the one or more lighting models along with each component's relative location, position and orientation. This first location of the light source can, for example, be changed to a second location which is further from the workpiece model. With this second location, the rendering software can render a new simulated image (not shown). However, with the difference in light location or position, i.e., being further from the workpiece, the one or more edges, i.e., features, corresponding to one or more protrusions or fins 603A on the fin guard 603 may be less discernable to the computer vision application. Thus, such a light location would typically be considered a worse choice and part of a less preferred inspection station configuration than that of FIG. 11B, at least for inspecting the fin guard 603.

Figure 12A:
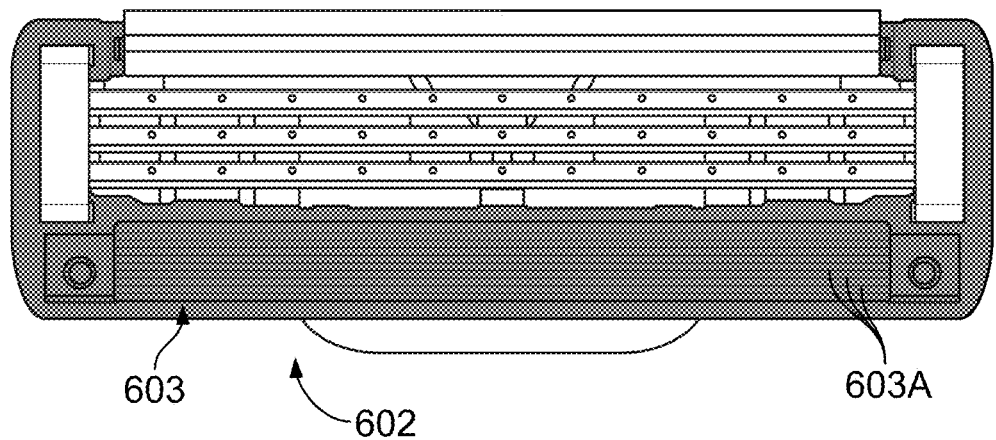
FIG. 12A and FIG. 12B illustrate how a change to an illumination source changes detectability of a workpiece attribute in accordance with the principles of the present disclosure.
Figure 12B:
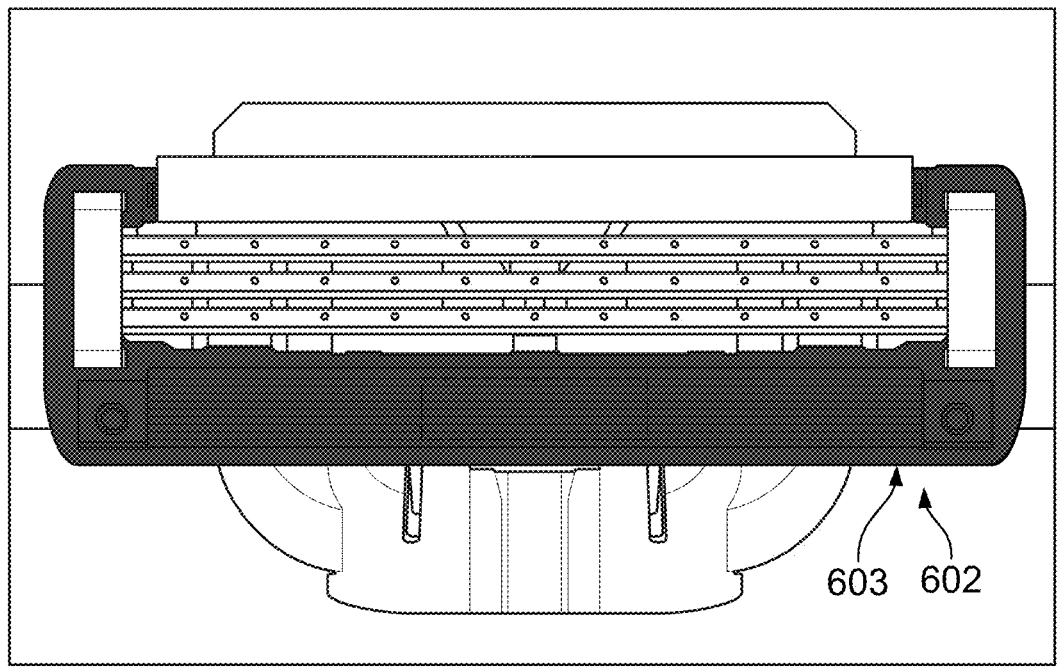

FIG. 12A and FIG. 12B illustrate how a change to an illumination source changes detectability of a feature or pattern corresponding to a workpiece attribute in accordance with the principles of the present disclosure. In FIG. 12A, the mechanical layout model assembly includes two light sources similar to the configuration shown in FIG. 1A. In this case, one or more edges, i.e., features, corresponding to one or more protrusions or fins 603A on the fin guard 603 are relatively easy to discern by the computer vision application. However, FIG. 12B corresponds to a configuration in which a backlight (e.g., 112 of FIG. 1A) is removed. With the difference in light sources, the one or more edges corresponding to one or more protrusions or fins 603A on the fin guard 603 are less discernable to the computer vision application. Thus, the light sources of FIG. 12B would typically be considered part of a worse inspection station configuration than that of FIG. 12A, at least for inspecting the fin guard 603.

As described above, a user of the computer vision system can define or select searchable features or patterns that are to be searched for in a simulated image to determine whether or not that searchable feature or pattern is detectable, discernable or identifiable in the image. Example searchable features include edges, circles, boxes, lines, patterns, line pairs, multiple edges, irregular features, and any other types of features for which the computer vision application provides a tool and wherein each feature corresponds to an attribute of a workpiece. Thus, determining whether a searchable feature is discernable or detectable in a simulated image is equivalent to determining whether the corresponding attribute of the workpiece is discernable or identifiable in the image. Referring back to FIGS. 8A-8F and FIG. 9A, and FIG. 9B, an inspectability metric can be assigned when determining whether or not a particular searchable feature or pattern is discernable, i.e., identifiable, or not. In some instances, as described earlier, that inspectability metric was a confidence level. For example, if the desired searchable feature is a line 20 pixels long, then finding a line that is 18 pixels long may indicate that there is a 95% confidence that the found line is the desired searchable feature. However, if a line of only 14 pixels is found, then there is only a 50% confidence that the found line is the desired searchable feature. The inspectability metric also could just be the length of the found line (e.g., 18 vs. 14). As noted above, the inspectability metric may further comprise a detected contrast value for adjacent lines of pixels or correspond to a number or percentage of pixels found in an image that match a pattern. The inspectability metric may be a binary indicator that indicates whether or not the feature is present in the image. The inspectability metric can be a combination of individual scores such as, for example, the length of a found line along with the angle of the found line. When both the length and angle are similar to a definition of the desired searchable feature, the overall score may be high. If both the length and angle of the found line are relatively dissimilar with the definition of the desired searchable feature, then the overall score may be low for the found line. When one of the length or angle is similar for the found line but the other is dissimilar to the definition of the desired feature, then the overall score may be an intermediate value.

Generalizing the above specific examples, for each desired searchable feature, the computer vision system may analyze a region of interest, which may comprise the entire image or only a portion of the image, and calculates an inspectability metric that is indicative of a visual discernibility of the searchable feature or, in other words, that is indicative of the visual discernibility of the corresponding attribute of the workpiece in the simulated image. Thus, the respective inspectability metric for a workpiece attribute may be higher or lower in two different simulated images. That difference reveals that in the simulated image for which the inspectability metric is higher, the feature corresponding to the workpiece attribute of interest is more visually discernable or identifiable than in the other simulated image. Utilizing the inspectability metric, the computer vision system can autonomously compare two different designs of the modeled inspection station and workpiece to determine which one is a better design for visually detecting a feature corresponding to an attribute of a workpiece if the modeled inspection station were physically implemented.

Figure 13:
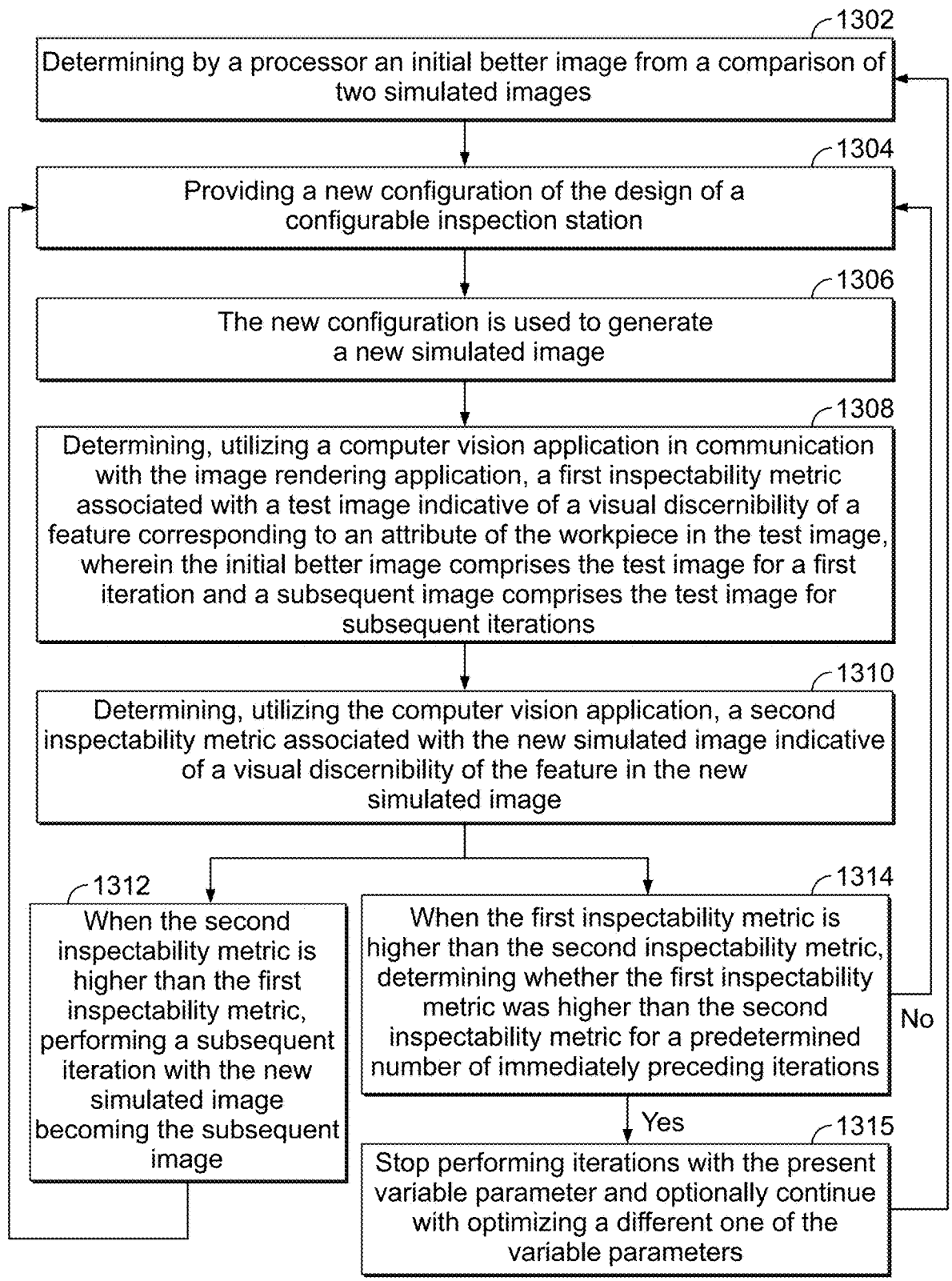
FIG. 13 is a flowchart of an example method of evaluating the design of the configurable inspection station in accordance with the principles of the present disclosure.

FIG. 13 is a flowchart of an example method of evaluating the design of the configurable inspection station in accordance with the principles of the present disclosure. The method of FIG. 13 can be performed by one or more processors such as one or more computers or similar device(s) that executes operations defined in programmable code stored in a manner accessible by the one or more processors. As noted above, the virtual inspection station and virtual workpiece have a number of design parameters that can be varied. These design parameters can include a variable workpiece parameter, a variable illumination parameter, a variable workpiece fixture parameter, a variable camera parameter, a variable optics parameter and the like. Each variable parameter may have a number of different possible instances, wherein any one of those instances could be selected for use in a particular design or configuration of the virtual inspection station or virtual workpiece. These instances may define a number and type of lighting models and corresponding light mappings, a camera model, a workpiece model and material mapping, a workpiece fixture model and corresponding material mapping and optics models. The relative positions of the camera model, lighting models, workpiece and workpiece fixture models may be varied as well to create different configurations of the inspection station. The different configurations can be modeled and evaluated to determine which configuration(s) is helpful in inspecting a workpiece to determine whether or not a feature corresponding to a particular attribute of the workpiece would be discernable if the modeled inspection station were to be physically implemented. Thus, embodiments in accordance with the principles of the present disclosure relate to a method for evaluating a design of a configurable inspection station for inspecting a workpiece, wherein the design of the configurable inspection station has a plurality of changeable design parameters. Furthermore, a system for simulating a computer vision based inspection station can iteratively change an instance of one of the design parameters to converge to an optimum instance for the one parameter.

The flowchart of FIG. 13, begins in step 1302 after two simulated images have been rendered by an image rendering application. Each simulated image is based on a corresponding design of the configurable inspection station and workpiece. One design has a first set of instances for the variable design parameters and the second design has a second set of instances for the variable design parameters. At least one of the instances is different between the first and second sets. For example, in a first design, a first instance may comprise a first lighting model and a corresponding first light mapping having a first intensity. In a second design, a second instance may comprise the first lighting model and a second light mapping having a second intensity different from the first intensity. In step 1302, a processor determines an initial better image from a comparison of the two simulated images. As described above, a "better" image is one in which the inspectability metrics associated with the images indicate the desired feature corresponding to the attribute of interest of the workpiece is more visually discernable in the one "better" image than in the other image. Next, a new design of the configurable inspection station is generated by using a new set of instances for the design parameters where at least one instance for one parameter is different in the new set from an instance for the same parameter used in the prior set of design parameters. If the change results in a better image, then the process can continue. If the change results in a worse image, then the process can stop or a new design of the configurable inspection station can be generated by changing the instance of the one parameter or one or more other parameters.

Thus, the flowchart of FIG. 13 shows a method in which the processor either alone or in combination with one or more other processors iteratively performs a number of steps. The method includes, in step 1304, providing a new configuration of the design of the configurable inspection station. This "providing" step may involve a CAD application comprising CAD software providing a modeled inspection station to the image rendering application where light and material mappings are applied to corresponding modeled lights and one or more modeled components to define the new configuration of the design of the configurable inspection station. A user may select a desired light mapping or a desired material mapping using the image rendering software where the mappings are included with the image rendering software or provided externally by other sources to the image rendering software for use by the image rendering software. In step 1306, the new configuration is used to generate, utilizing the image rendering application, a new simulated image. Knowledge of the different instances of one of the parameters in the initial two images and thus, the direction in which the parameter instance changes to arrive at the better image may also be known. When the new configuration is provided, the new set of instances can include a change in that one parameter in the same direction indicated by the better image. As an example, if the better image has an instance defining a light intensity greater than that of the other image, then the new configuration would have a new instance with a light mapping having a light intensity greater than that of the better image. As another example, if an instance defines a material mapping providing a lightened color of a workpiece, which raises the discernibility of an edge (i.e., the inspectability metric), then the new instance would define a material mapping having even a lighter color.

As noted, the new configuration includes a new set of instances for the plurality of variable parameters, wherein one instance of one parameter is different in the new set as compared to a set corresponding to a test image. For the first iteration through, the test image comprises the initial better image and for subsequent iterations, the test image is defined by the subsequent image. Thus, for the first iteration, the two simulated images are that initial better image (now labeled "a test image") and the new simulated image.

The process of FIG. 13 continues in step 1308 with the processor determining, utilizing a computer vision application in communication with the image rendering application, a first inspectability metric associated with the test image indicative of a visual discernibility of a feature corresponding to an attribute of the workpiece in the test image. Step 1310 is similar to step 1308 but involves the processor determining, utilizing the computer vision application, a second inspectability metric associated with the new simulated image indicative of a visual discernibility of the feature corresponding to the attribute of the workpiece in the new simulated image.

Accordingly, when the second inspectability metric is higher than the first inspectability metric, the process continues in step 1312 by returning to step 1304 in order to perform a subsequent iteration with the new simulated image from the just completed iteration becoming the subsequent image used in that next iteration.

The process iteratively continues with progressively better images until, in step 1314, a determination is made that the first inspectability metric is higher than the second inspectability metric. Rather than simply stopping when this condition first occurs, additional iterations can still be performed by returning to step 1304. For example, in step 1314, a determination is made as to whether the first inspectability metric was higher than the second inspectability metric for a predetermined number of immediately preceding iterations. If not, then the process continues in step 1314 by returning to step 1304 in order to perform a subsequent iteration with the test image remaining the subsequent image used in that next iteration.

If, in step 1314 it is determined that the first inspectability metric was higher than the second inspectability metric for the predetermined number of immediately preceding iterations, then the process continues in step 1315. At this point the instance of the one parameter in the configuration associated with the last subsequent (or test) image has produced a higher inspectability metric than any other instance of that parameter (when all other parameter instances remain the same throughout the process), and thus, the iterations can stop in step 1315. However, the process of FIG. 13 can be repeatedly performed by returning to step 1302 from step 1315. Each such performance involves optimizing a different one of the variable parameters of the configurable inspection station.

Below are two simplified examples, using non-real numbers, illustrating the principles of the flowchart of FIG. 13. Each line represents an iteration in which a new configuration has been received such that a respective hypothetical inspectability metric has been calculated for each of the test image and the new image of that iteration.

Example #1

1 (test=0.85, new=0.9) The changed parameter instance has resulted in a higher inspectability metric. So the inspectability metric of the new image is used as the value for the test image in the next iteration.
2 (test=0.9, new=0.92)
3 (test=0.92, new=0.95)
4 (test=0.95, new=0.92) The changed parameter instance no longer appears to be beneficial. However, a few more (e.g. 2) iterations can be performed as verification with the test image remaining the same in the next iteration.
5 (test=0.95, new=0.91)
6 (test=0.95, new=0.9) There have been 3 consecutive iterations with the second inspectability metric lower than the first metric so the changes are not converging towards an optimal instance for the parameter that was being changed.
Next step: A new parameter could be selected and the process repeated for that parameter or the process can stop. Of all the configurations analyzed in the above iterations, the configuration that resulted in the simulated image having an inspectability metric of 0.95 is determined to be the optimal configuration of the design of the configurable inspection station.

Example #2

1 (test=0.85, new=0.9) The changed parameter instance has resulted in a higher inspectability metric. So the inspectability metric of the new image is used as the value for the test image in the next iteration.
2 (test=0.9, new=0.92)
3 (test=0.92, new=0.95)
4 (test=0.95, new=0.92) The changed parameter instance no longer appears to be beneficial. However, a few more (e.g., 2) iterations can be performed as verification with the test image remaining the same in the next iteration.
5 (test=0.95, new=0.94) The changed parameter instance has resulted in a new image that is an improvement over the new image of the previous iteration but the new inspectability metric is still lower than that of the test image.
6 (test=0.95, new=0.96) The changed parameter instance has resulted in a new image that is an improvement over the test image, so more iterations are performed with the new image becoming the test image for the next iteration.
7 (test=0.96, new=0.98)
8 (test=0.98, new=0.92) The changed parameter instance no longer appears to be beneficial. However, a few more (e.g., 2) iterations can be performed as verification with the test image remaining the same in the next iteration.
9 (test=0.98, new=0.91)
10 (test=0.98, new=0.9) There have been 3 consecutive iterations with the second inspectability metric lower than the first metric so the changes are not converging towards an optimal instance for the parameter that was being changed.
Next step: A new parameter could be selected and the process repeated for that parameter or the process can stop. Of all the configurations analyzed in the above iterations, the configuration that resulted in the simulated image having an inspectability metric of 0.98 is determined to be the optimal configuration of the design of the configurable inspection station.

The flowchart and block diagrams in the Figures illustrate the architecture, functionality, and operation of possible implementations of systems, methods and computer program products according to various aspects of the present disclosure. In this regard, each block in the flowchart or block diagrams may represent a module, segment, or portion of code, which comprises one or more executable instructions for implementing the specified logical function(s). In addition, while the flowcharts have been discussed and illustrated in relation to a particular sequence of events, it should be appreciated that changes, additions, and omissions to this sequence may occur without materially affecting the operation of the disclosure. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, microcode, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Computer program code for carrying out operations for aspects of the present disclosure may be written in any combination of one or more programming languages, including an object oriented programming language such as JAVA, SCALA, SMALLTALK, EIFFEL, JADE, EMERALD, C++, CII, VB.NET, PYTHON or the like, conventional procedural programming languages, such as the "c" programming language, VISUAL BASIC, FORTRAN 2003, PERL, COBOL 2002, PHP, ABAP, dynamic programming languages such as PYTHON, RUBY, and GROOVY, or other programming languages. The program code may execute entirely on the user's computer or device.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed may direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions that execute on the computer or other programmable apparatus provide processes for implementing the functions/acts specified in the flowchart and/or block diagram block or blocks.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method for evaluating a design of a configurable inspection station for inspecting a workpiece, the design of the configurable inspection station having a plurality of variable parameters, and the method comprising:
   determining, by a processor, an initial better image from a comparison of two simulated images, each of the two simulated images generated by an image rendering application based on respective corresponding configurations of the design of the configurable inspection station, each corresponding configuration comprising a respective set of instances for the plurality of variable parameters;
   iteratively performing a set of steps comprising:
      providing a new configuration of the design of the configurable inspection station, the new configuration comprising a new set of instances for the plurality of variable parameters,
         wherein one instance of one parameter is different in the new set as compared to a set corresponding to a test image, and
         wherein the initial better image comprises the test image for a first iteration and a subsequent image comprises the test image for subsequent iterations;
      generating a new simulated image based on the new configuration;
      determining, by the processor utilizing a computer vision application in communication with the image rendering application, a first inspectability metric associated with the test image;
      determining, by the processor utilizing the computer vision application, a second inspectability metric associated with the new simulated image; and
      when the second inspectability metric is higher than the first inspectability metric, performing a subsequent iteration with the new simulated image becoming the subsequent image.

2. The method of claim 1, wherein the set of steps iteratively performed further comprises:
   when the first inspectability metric is higher than the second inspectability metric:
      determining whether the first inspectability metric was higher than the second inspectability metric for a predetermined number of immediately preceding iterations; wherein
         when the first inspectability metric was not higher than the second inspectability metric for the predetermined number of immediately preceding iterations, performing the subsequent iteration with the test image remaining the subsequent image.

3. The method of claim 1, wherein the set of steps iteratively performed further comprises:
   when the first inspectability metric is higher than the second inspectability metric:
      determining whether the first inspectability metric was higher than the second inspectability metric for a predetermined number of immediately preceding iterations; wherein when the first inspectability metric was higher than the second inspectability metric for the predetermined number of immediately preceding iterations, stop performing iterations.

4. The method of claim 3, comprising:
after performing iterations has stopped, identifying, by the processor, a best image having a highest associated inspectability metric; and
selecting an optimal instance for the one parameter based on the configuration of the design of the configurable inspection station corresponding with the best image.

5. The method of claim 1, wherein the first inspectability metric is indicative of a visual discernibility of a feature corresponding to an attribute of the workpiece in the test image.

6. The method of claim 5, wherein the attribute of the workpiece comprises one of a geometric feature, an edge, a two-dimensional logo, a three-dimensional logo, a corner or a surface section of the workpiece.

7. The method of claim 1, wherein the second inspectability metric is indicative of a visual discernibility of a feature corresponding to an attribute of the workpiece in the new simulated image.

8. The method of claim 1, wherein the one parameter comprises an illumination parameter.

9. The method of claim 8, wherein the one instance of the illumination parameter in the new set comprises a new lighting model.

10. The method of claim 8, wherein the one instance of the illumination parameter in the new set comprises a new light mapping.

11. The method of claim 1, wherein, for a second and all subsequent iterations, the set of steps further comprises:
determining the one instance of the one parameter based on:
a) an instance of the one parameter in an immediately preceding iteration, and
b) whether or not the second inspectability metric was greater than the first inspectability metric, in the immediately preceding iteration.

12. The method of claim 1, wherein the processor performs each of the set of steps.

13. The method of claim 1, wherein a second processor performs the steps of providing a new configuration of the design of the configurable inspection station and generating a new simulated image.

14. A system for evaluating a design of a configurable inspection station for inspecting a workpiece, the design of the configurable inspection station having a plurality of variable parameters, and the system comprising:
a memory storing executable instructions;
a processor in communication with the memory, the processor when executing the executable code:
determines an initial better image from a comparison of two simulated images, each of the two simulated images generated by an image rendering application based on respective corresponding configurations of the design of the configurable inspection station, each corresponding configuration comprising a respective set of instances for the plurality of variable parameters;
iteratively performs a set of steps comprising:
receives from the image rendering application a new simulated image based on a new configuration; wherein the new configuration comprises a new set of instances for the plurality of variable parameters, wherein the instance of one variable parameter is different in the new set of instances as compared to a set corresponding to a test image, and
wherein the initial better image comprises the test image for a first iteration and a subsequent image comprises the test image for subsequent iterations;
determines, utilizing a computer vision application in communication with the image rendering application, a first inspectability metric associated with the test image;
determines, utilizing the computer vision application, a second inspectability metric associated with the new simulated image; and
when the second inspectability metric is higher than the first inspectability metric, performs a subsequent iteration with the new simulated image becoming the subsequent image.

15. The system of claim 14, wherein the set of steps iteratively performed further comprises:
when the first inspectability metric is higher than the second inspectability metric:
determine whether the first inspectability metric was higher than the second inspectability metric for a predetermined number of immediately preceding iterations; wherein
when the first inspectability metric was not higher than the second inspectability metric for the predetermined number of immediately preceding iterations, perform the subsequent iteration with the test image remaining the subsequent image.

16. The system of claim 14, wherein the set of steps iteratively performed further comprises:
when the first inspectability metric is higher than the second inspectability metric:
determine whether the first inspectability metric was higher than the second inspectability metric for a predetermined number of immediately preceding iterations; wherein when the first inspectability metric was higher than the second inspectability metric for the predetermined number of immediately preceding iterations, stop performing iterations.

17. The system of claim 16, wherein, the processor when executing the executable code:
after performing iterations has stopped, identifies a best image having a highest associated inspectability metric; and
selects an optimal instance for the one parameter based on the configuration of the design of the configurable inspection station corresponding with the best image.

18. The system of claim 14, wherein the first inspectability metric is indicative of a visual discernibility of a feature corresponding to an attribute of the workpiece in the test image.

19. The system of claim 18, wherein the attribute of the workpiece comprises one of a geometric feature, an edge, a two-dimensional logo, a three-dimensional logo, a corner or a surface section of the workpiece.

20. The system of claim 14, wherein the second inspectability metric is indicative of a visual discernibility of a feature corresponding to an attribute of the workpiece in the new simulated image.

21. The system of claim 14, wherein the one parameter comprises an illumination parameter.

22. The system of claim 21, wherein the one instance of the illumination parameter in the new set comprises a new lighting model.

23. The method of claim 21, wherein the one instance of the illumination parameter in the new set comprises a new light mapping.

24. The method of claim 14, wherein, for a second and all subsequent iterations, the set of steps further comprises:
determine the one instance of the one parameter based on:
   a) an instance of the one parameter in an immediately preceding iteration, and
   b) whether or not the second inspectability metric was greater than the first inspectability metric, in the immediately preceding iteration.

\* \* \* \* \*